US012587146B2

(12) United States Patent
Bollinger et al.

(10) Patent No.: US 12,587,146 B2
(45) Date of Patent: Mar. 24, 2026

(54) POWER AMPLIFIER DEVICES WITH IN-PACKAGE MATCHING CIRCUITS THAT PROVIDE PSEUDO INVERSE CLASS F OPERATION

(71) Applicant: NXP USA, Inc., Austin, TX (US)

(72) Inventors: Laure Bollinger, Cugnaux (FR); Yuanyuan Dong, Plaisance du Touch (FR); Aniket Anant Wadodkar, Gilbert, AZ (US); Liang Xu, Chengdu (CN)

(73) Assignee: NXP USA, INC., Austin, TX (US)

( * ) Notice: Subject to any disclaimer, the term of this patent is extended or adjusted under 35 U.S.C. 154(b) by 534 days.

(21) Appl. No.: 18/173,855

(22) Filed: Feb. 24, 2023

(65) Prior Publication Data

US 2024/0171132 A1 May 23, 2024

(30) Foreign Application Priority Data

Nov. 18, 2022 (CN) .......................... 202211452662.3

(51) Int. Cl.
| | |
|---|---|
| *H03F 1/56* | (2006.01) |
| *H03F 1/02* | (2006.01) |
| *H03F 3/21* | (2006.01) |
| *H03F 3/213* | (2006.01) |

(52) U.S. Cl.
CPC ........... *H03F 1/565* (2013.01); *H03F 1/0288* (2013.01); *H03F 3/211* (2013.01); *H03F 3/213* (2013.01); *H03F 2200/387* (2013.01)

(58) Field of Classification Search
None
See application file for complete search history.

(56) References Cited

U.S. PATENT DOCUMENTS

| | | | |
|---|---|---|---|
| 9,319,010 B1 | 4/2016 | Staudinger et al. | |
| 2019/0296693 A1 | 9/2019 | Ahmed et al. | |
| 2019/0356274 A1 | 11/2019 | Zhu et al. | |
| 2021/0175866 A1 | 6/2021 | Li et al. | |

OTHER PUBLICATIONS

Carrubba et al.: Internally-packaged-matched continuous inverse class-FI wideband GaN HPA, Proceedings of the 11th European Microwave Integrated Circuits Conference, Oct. 3-4, 2016, London, UK, 4 pages.

Sharma et al.: "Novel Continuous Inverse Class F Power Amplifier for High Power 5G Macro Base Station Application", 2021 IEEE MTT-S International Microwave Symposium (IMS), Date of Conference: Jun. 7-25, 2021, 3 pages.

*Primary Examiner* — Andrea Lindgren Baltzell
*Assistant Examiner* — Malane Lieng
(74) *Attorney, Agent, or Firm* — Sherry W. Gourlay

(57) ABSTRACT

A power amplifier device includes an amplification path implemented within a power amplifier package. The amplification path includes input and output package leads, a transistor die with transistor input and output terminals and a power transistor, and a two-stage input impedance matching circuit electrically coupled between the input package lead and the transistor input terminal. The two-stage input impedance matching circuit has a double T-match topology that includes a first resonator coupled to the first input package lead, and a second resonator coupled between the first resonator and the transistor input terminal. The amplification path also includes an output impedance matching circuit coupled between the transistor output terminal and the first output package lead, and a second output harmonic termination circuit coupled to the first output package lead.

19 Claims, 10 Drawing Sheets

POWER AMPLIFIER DEVICES WITH IN-PACKAGE MATCHING CIRCUITS THAT PROVIDE PSEUDO INVERSE CLASS F OPERATION

CROSS-REFERENCE TO RELATED APPLICATION

This application claims the priority under 35 U.S.C. § 119 to Chinese patent application no. 202211452662.3, filed on 18 Nov. 2023, the contents of which are incorporated by reference herein.

TECHNICAL FIELD

Embodiments of the subject matter described herein relate generally to radio frequency (RF) power amplifiers, and more particularly to power transistor devices within RF power amplifiers, and methods of manufacturing such devices and amplifiers.

BACKGROUND

Wireless communication systems employ power amplifiers for increasing the power of radio frequency (RF) signals. In a cellular base station, for example, a high-power RF amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

Implementations of high-power RF amplifiers often include a packaged power transistor device mounted to a printed circuit board (PCB). In some conventional amplifiers, impedance matching between the PCB circuitry and the power transistor within the package is implemented on the PCB, and such amplifiers are unmatched within the package. For example, a typical inverse class F amplifier may include a power transistor device that is unmatched within the package, and the inverse class F operation is obtained on the PCB. However, such amplifier configurations may have sub-optimal performance, particularly when the peripheries of the packaged power transistors, and thus their parasitic output capacitances, are relatively large. Essentially, for amplifiers that include packaged power transistors with high parasitic output capacitances, PCB matching intended to maximize output power becomes more difficult. These difficulties are even more acute for amplifier systems that are severely space-limited. Accordingly, what are needed are compact amplifier circuits and packaged power transistor devices with well-matched high-periphery power transistors.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
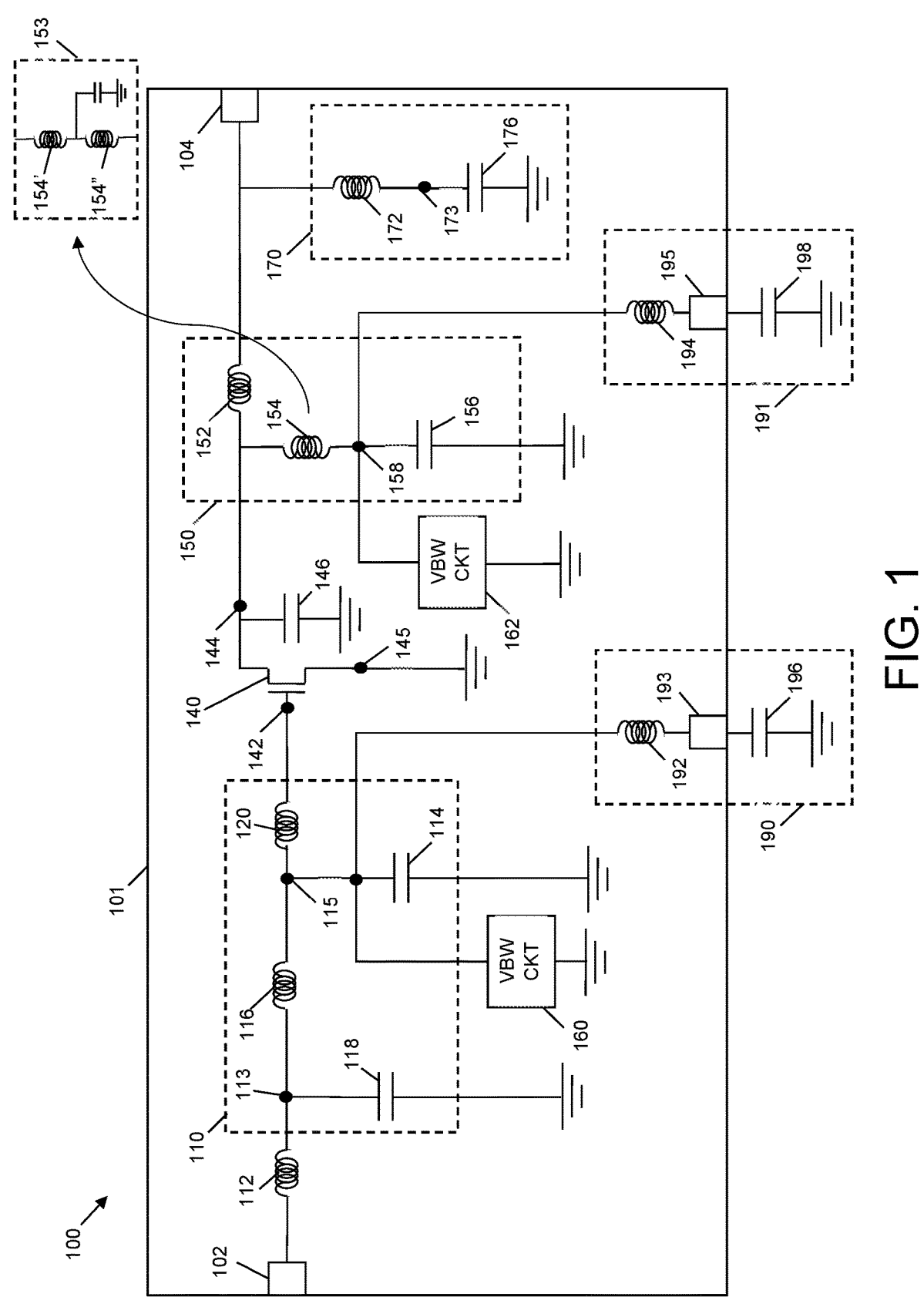
FIG. 1 is a schematic circuit diagram of a power amplifier circuit, in accordance with an example embodiment.

In the field of high-power radio frequency (RF) power amplification for cellular base stations and other applications, broadband power amplification using silicon-based devices (e.g., laterally diffused metal oxide semiconductor (LDMOS) power transistor devices with output matching networks) has been successfully achieved. However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification (e.g., over 20 percent fractional bandwidth).

For example, the nonlinear input capacitance of RF power devices that include GaN transistors are known to generate harmonics and intermodulation distortion that can impair efficiency and linearity. For example, signal energy at the second harmonic of the center frequency of operation, $f_o$, of the amplifier 300 (also referred to herein as the "fundamental frequency" of operation) may degrade the performance of the amplifier, if not compensated for. Accordingly, second harmonic termination circuits also play an important role in the overall performance of a power amplifier design that uses GaN-based transistors. Without the information of second harmonic impedance at the current source terminal plane, it is very difficult to tune a power amplifier to achieve relatively high fractional bandwidth with good performance. Furthermore, the second harmonic termination may vary significantly across a large bandwidth for broadband applications, which further increases the difficulty of circuit tuning.

To overcome these and other challenges in designing broadband power amplifiers using GaN-based devices, embodiments disclosed herein include "pseudo" inverse class F amplifier circuits (e.g., circuit 100, FIG. 1) and "true" inverse class F amplifier circuits (e.g., circuit 500, FIG. 5), partially implemented with a high-power packaged power transistor device (e.g., devices 400, 600, FIGS. 4A and 6) with unique, in-package, input and output impedance matching topologies. Class F and inverse class F amplifiers have a 50 percent conduction angle and operate in a switching mode. A conventional class F amplifier may include one or more odd harmonic resonators in its output network to shape the drain-to-source voltage, $V_{DS}$, so that the transistor switching loss is reduced and the efficiency is increased. In contrast, a conventional inverse class F amplifier may have one or more even harmonic resonators in its output network to shape the drain-to-source voltage (e.g., to shape the drain current to be a square wave and the drain-to-source voltage to be a sine wave).

Embodiments of amplifiers disclosed herein provide inverse class F operation using a two-stage input matching network that provides input-side harmonic control, and that is optimized for an output matching network that provides a relatively high real part of a fundamental output impedance. More particularly, within a packaged power transistor device, various embodiments include an input matching circuit with a two-stage low-pass filter circuit (e.g., a two-stage or double T-match input impedance circuit 110, FIGS. 1, 5) in which a second resonator of the circuit handles the function of a harmonic resonator to place the second harmonic impedance in a region of the Smith chart (e.g., Smith chart 700, FIG. 7A) that is distanced from a short circuit to ensure a good AM/AM profile and higher −3 dB efficiency. The various embodiments may result in maximum −3 dB power without compromising the drain efficiency of the device. In addition, the input matching circuit functions as a broadband impedance transformer with a good Q factor, which helps to improve dispersion of the input impedances over frequency. This may result in improved gain due to the good Q factor impedance transformation.

Various embodiments also include an output impedance matching circuit with a "shunt-L" circuit (e.g., including inductive element 154, FIGS. 1, 5) that may improve the output impedances at the lead plane of the power amplifier. As used herein, "shunt" refers to a circuit or component that has one terminal coupled to the main transmission path of the amplifier, and another terminal coupled to ground. An RF cold point (at the fundamental frequency) in the output impedance matching circuit allows for connection of a video bandwidth enhancement circuit (e.g., circuit 162, FIGS. 1, 5) that may function to improve the low frequency resonance of the amplifier circuit caused by the interaction between the output impedance matching circuit and the amplifier bias feeds by presenting a low impedance at envelope frequencies and/or a high impedance at RF frequencies. In addition, an embodiment of the output impedance matching circuit also includes a series inductor-capacitor (LC) resonator circuit (e.g., circuit 170, FIGS. 1, 5) connected to the device output lead, which may be optimized around the second harmonic frequency. This series LC resonator circuit provides a short at the second harmonic frequency, which is transformed through an inductance to an open circuit at the current source (e.g., drain terminal) of the power transistor (e.g., transistor 140, FIGS. 1, 5). This configuration may make the second harmonic termination less sensitive to amplifier changes that may be implemented on the PCB portion of the amplifier (i.e., changes made at the package plane of the amplifier).

Figure 5:
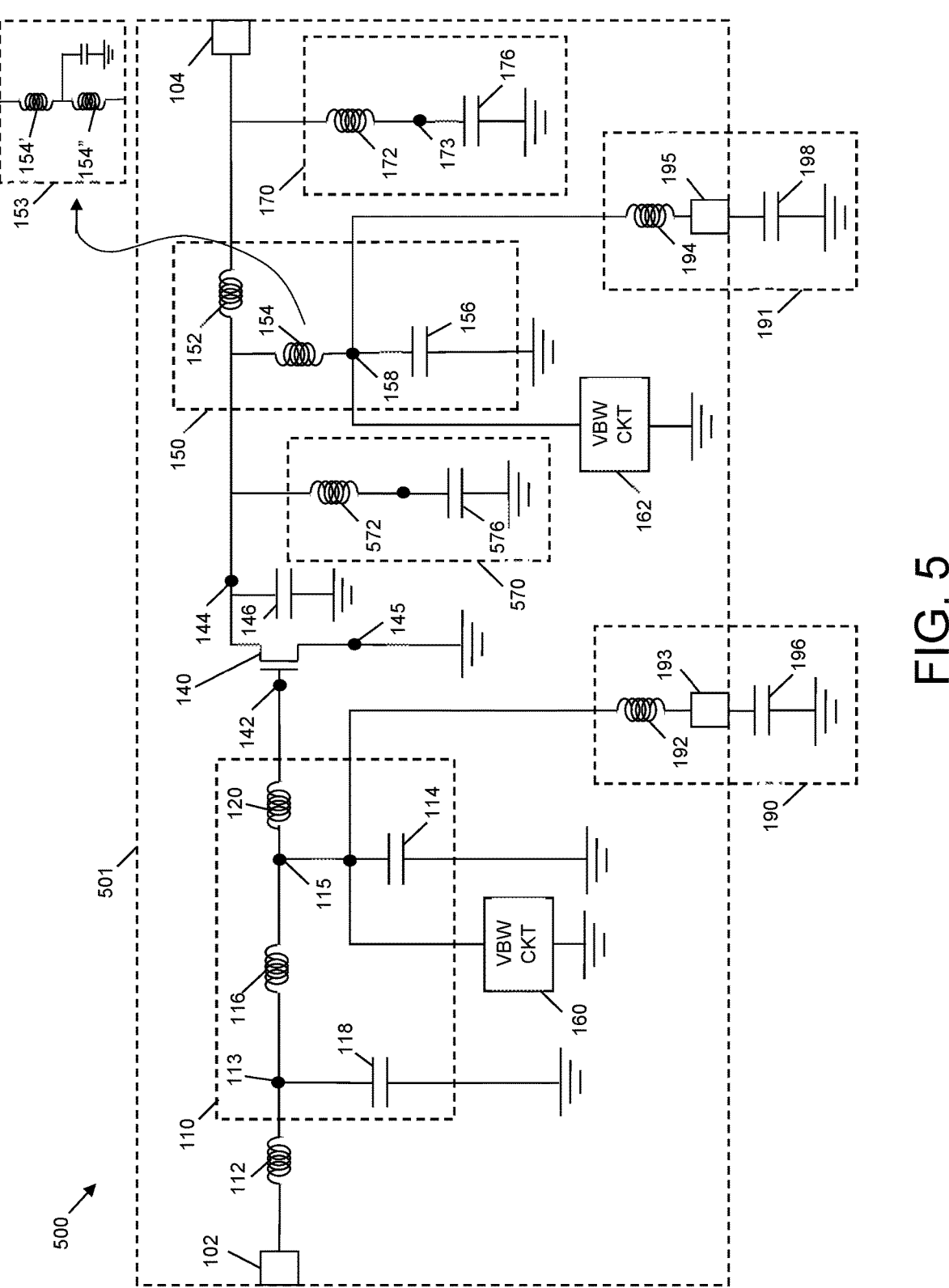
FIG. 5 is a schematic circuit diagram of a power amplifier circuit, in accordance with another example embodiment.

Essentially, certain embodiments of power transistor devices described herein include an input matching circuit (e.g., circuit 110, FIGS. 1, 5) realized by a two-stage low-pass filter, and an output matching circuit with a shunt-L circuit (e.g., circuit 150, FIGS. 1, 5) connected to a DC blocking capacitor (e.g., capacitor 156, FIGS. 1, 5) and a second harmonic resonator circuit (e.g., circuit 170, FIGS. 1, 5). Such embodiments may be considered to be "pseudo" class F amplifiers, as these embodiments do not specifically include third harmonic control circuitry. In other embodiments, third harmonic control circuitry (e.g., circuit 570, FIG. 5) may be directly connected to the output (e.g., drain) of the power transistor die, resulting in a power amplifier circuit with "true" inverse class F operation. Various other embodiments also are described herein.

FIG. 1 is a schematic diagram of an RF power amplifier circuit 100 that may be implemented within a packaged power transistor device, in accordance with an embodiment. Amplifier circuit 100 essentially is a "pseudo" inverse class F amplifier with an in-package, two-stage input impedance matching circuit that also provides harmonic impedance control. By including the input impedance matching circuit within the device package (rather than implemented on the PCB to which the device package is connected), amplifier 100 may achieve improved performance from inverse class F operation. Further, amplifier circuit 100 includes an in-package output impedance matching circuit that is adapted for relatively high-periphery power transistors (e.g., GaN transistors). The output impedance matching circuit provides a higher real part of the fundamental output impedances. Further, the output circuit includes an output harmonic termination that brings the amplifier circuit 100 closer to a true inverse class F operation, thus ensuring good amplifier performance.

Circuit 100 includes an input lead 102 (e.g., a first conductive package lead), an input impedance matching circuit 110, a transistor 140, an output impedance matching circuit 150, video bandwidth (VBW) circuits 160, 162 (also referred to as baseband decoupling circuits), harmonic termination circuit 170, bias circuits 190, 191, and an output lead 104 (e.g., a second conductive package lead), in an embodiment. Each of the input and output leads 102, 104 may be more generally referred to as an "RF input/output (I/O)." According to an embodiment, the components of circuit 100 that are incorporated within a discrete packaged amplifier device (e.g., device 400, FIG. 4A) are encompassed by box 101. When the packaged amplifier device is connected to a PCB to form a complete power amplifier, the device components within box 101 are electrically connected to conductive traces and components on the PCB through the various device leads (e.g., input lead 102, output lead 104, and bias leads 193, 195).

The input impedance matching circuit 110 and video bandwidth circuit 160 may be referred to collectively as an "input circuit." Similarly, the output impedance matching circuit 150, video bandwidth circuit 162, and harmonic termination circuit 170 may be referred to collectively as an "output circuit." Although transistor 140 and various elements of the input and output impedance matching circuits 110, 150, the video bandwidth circuits 160, 162, and the harmonic termination circuit 170 are shown as singular components, the depiction is for the purpose of ease of explanation only. Those of skill in the art would understand, based on the description herein, that transistor 140 and/or certain elements of the input impedance matching circuit 110, the harmonic termination circuit 170, the output impedance matching circuit 150, and the video bandwidth circuits 160, 162 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 140 and various elements of the input impedance matching circuit 110, the output impedance matching circuit 150, the video bandwidth circuits 160, 162, and the harmonic termination circuit 170, below, thus are not intended to limit the scope of the inventive subject matter only to the illustrated embodiments.

Input lead 102 and output lead 104 each may include a conductor, which is configured to enable the circuit 100 to be electrically coupled with external circuitry (not shown). More specifically, the input and output leads 102, 104 are physically positioned to span between the exterior and the interior of a device package, in an embodiment. Input impedance matching circuit 110 and video bandwidth circuit 160 are electrically coupled between the input lead 102 and a first terminal 142 of transistor 140 (e.g., the gate terminal). Similarly, output impedance matching circuit 150, video bandwidth circuit 162, and harmonic termination circuit 170 are electrically coupled between a second terminal 144 of transistor 140 (e.g., the drain terminal) and the output lead 104. A third terminal 145 of transistor 140 (e.g., the source terminal) is coupled to a ground reference node.

According to an embodiment, transistor 140 is the primary active component of circuit 100. Transistor 140 includes a control terminal 142 and two current conducting terminals 144, 145, where the current conducting terminals 144, 145 are spatially and electrically separated by a variable-conductivity channel. For example, transistor 140 may be a field effect transistor (FET), which includes a gate terminal (control terminal 142), a drain terminal (a first current conducting terminal 144), and a source terminal (a second current conducting terminal 145). According to an embodiment, and using nomenclature typically applied to FETs in a non-limiting manner, the gate terminal 142 of transistor 140 is coupled to the input impedance matching circuit 110 and the video bandwidth circuit 160, the drain terminal 144 of transistor 140 is coupled to the output impedance matching circuit 150, the video bandwidth circuit 162, and the harmonic termination circuit 170, and the source terminal 145 of transistor 140 is coupled to ground (or another voltage reference). Through the variation of control signals provided to the gate terminal of transistor 140, the current between the current conducting terminals of transistor 140 may be modulated.

According to various embodiments, transistor 140 is a III-V field effect transistor (e.g., a high electron mobility transistor (HEMT)), which has a relatively low drain terminal-source terminal capacitance, Cds, (represented by capacitance 146 and also referred to herein as the parasitic output capacitance) when compared with the drain terminal-source terminal capacitance of a silicon-based FET (e.g., a laterally diffused metal oxide semiconductor (LDMOS) FET). That said, the magnitude of the parasitic output capacitance 146 of transistor 140 generally is proportional to the periphery (e.g., size) of the transistor 140 (e.g., the size of the active area within the transistor die). Accordingly, as the periphery of the transistor 140 grows, the parasitic output capacitance 146 also grows. For example, the periphery of transistor 140 may be in a range of about 26 mm to about 80 mm, although the periphery of transistor 140 may be smaller or larger, as well.

In conventional amplifier devices in which no output matching is implemented between the drain of the transistor and the output lead, the output impedance is very low at the package plane (i.e., the interface between the circuitry within the packaged device and the PCB), and the relatively high parasitic output capacitance of relatively-large transistors makes matching on the PCB relatively difficult and space-consuming. As will be explained below, however, the input and output matching circuits 110, 150 of the various embodiments overcome the potential performance issues that otherwise may be encountered with a conventional device that is unmatched between the transistor output and the package plane.

In FIG. 1, the drain terminal-source terminal capacitance, Cds, of transistor 140 is represented with a shunt capacitance 146 at the drain terminal 144 of transistor 140. More specifically, capacitance 146 is not a physical component, but instead models the drain terminal-source terminal capacitance of transistor 140. In some embodiments, the magnitude of the parasitic output capacitance per millimeter (mm) of transistor periphery (i.e., the capacitance in picofarads per millimeter (pF/mm)) may be in a range of about 0.1 pF/mm to about 0.4 pF/mm, although the parasitic output capacitance in pF/mm may be smaller or larger, as well. For a periphery in the range of 26-80 mm and a parasitic output capacitance in the range of 0.1-0.4 pF/mm, multiplying the range of parasitic output capacitance in pF/mm by the range of peripheries in mm indicates that the total parasitic output capacitance 146 may be in a range of about 2.6 pF to about 32 pF, for example. As a more specific example, for a periphery of 30 mm and a parasitic output capacitance of 0.3 pF/mm, the total parasitic output capacitance 146 would equal 9 pF. Parasitic output capacitance 146 also may be represented in picofarads per Watt (pF/W), as well, by dividing the parasitic output capacitance 146 in pF/mm by the power handling capacity of transistor 140, represented in Watts/mm (W/mm). For example, when the parasitic output capacitance 146 in pF/mm is in a range of 0.1-0.4 pF/mm, and when transistor 140 is a GaN FET with a power handling capacity of about 10 W/mm, this corresponds to a parasitic output capacitance 146 of 0.01 pF/W to about 0.04 pF/W.

Again, it may be noted that the parasitic output capacitance 146 of a GaN FET is significantly lower than the parasitic output capacitance of a silicon-based FET (e.g., an LDMOS FET). In some embodiments, transistor 140 may be a GaN FET, although in other embodiments, transistor 140 may be another type of III-V transistor (e.g., gallium arsenide (GaAs), gallium phosphide (GaP), indium phosphide (InP), or indium antimonide (InSb)), or another type of transistor that has a relatively low drain terminal-source terminal capacitance.

As mentioned above, the input impedance matching circuit 110 and video bandwidth circuit 160, are electrically coupled between the input 102 and a first terminal 142 of transistor 140 (e.g., the gate terminal). According to one embodiment, a first series inductive element 112 (e.g., a first set of wirebonds 412, FIGS. 4B, 4C) is coupled between input 102 and the input impedance matching circuit 110. More specifically, the first series inductive element 112 is coupled between the input lead 102 and a first node 113 (e.g., bond pad 413, FIGS. 4B, 4C), which essentially corresponds to an input of the input impedance matching circuit 110. Besides functioning to make the electrical connection between the input lead 102 and the input impedance matching circuit 110, the first series inductive element 112 also may add reactance to a final transformed impedance provided by the input impedance matching circuit 110.

The input impedance matching circuit 110 is configured to transform (e.g., raise) the gate impedance of transistor 140 to a higher (e.g., intermediate or higher) impedance level (e.g., in a range from about 2 to about 10 ohms or higher).

The input impedance matching circuit 110 is designed so that, when the output side of amplifier 100 is operating in inverse class F mode, the transistor 140 will see a second harmonic source impedance, $Zs\_2f_0\_extrinsic=j*X$, where $1.3<X<3.0$, and the value of X depends on the gate periphery and Ropt. It may be noted here that the term "Zs," as used herein, corresponds to the value of the source impedance of transistor 140, and the term "Zs . . . extrinsic" corresponds to a value of the source impedance of transistor 140 that specifically does not include the gate-source capacitance, Cgs.

According to an embodiment, input impedance matching circuit 110 is a two-stage input impedance matching circuit that includes a two-stage low-pass filter circuit (e.g., a double T-match circuit). More particularly, circuit 110 includes second and third series inductive elements 116, 120 (e.g., second and third sets of wirebonds 416, 420, FIGS. 4B, 4C), a first shunt capacitance 118 (e.g., capacitor 418, FIGS. 4B, 4C) coupled to first node 113 between inductive elements 112 and 116, and a second shunt capacitance 114 (e.g., capacitor 414, FIGS. 4B, 4C) coupled to a second node 115 (e.g., bond pad 415, FIGS. 4B, 4C) between inductive elements 116 and 120. According to an embodiment, series inductive element 116 and shunt capacitance 118 form a first low-pass filter section (or first resonator) of the input matching network 110, and series inductive element 120 and shunt capacitance 114 form a second low-pass filter section (or second resonator) of the input matching network 110.

The double T-match circuit 110, and particularly the second resonator formed from inductive element 120 and capacitance 114 is configured to function as a second harmonic control circuit that will place the second harmonic impedance in a region away from a short circuit to ensure a good AM/AM profile and higher P-3 dB efficiency. According to an embodiment, for the double T-match circuit 110 coupled with the pseudo inverse class F design topology of amplifier 100, the second harmonic frequency, $2f_0$, is placed close to a 6 o'clock position in the respective gamma plane of the transistor 140, and the second resonator (i.e., inductive element 120 and capacitance 114) resonate at a lower frequency than $2f_0$, which helps to improve amplifier performance. For example, and according to an embodiment, the second resonator may resonate at a frequency that is from about 20 percent lower to about 40 percent lower than $2f_0$ (Zs_extrinsic plane) (e.g., about 30 percent lower than $2f_0$, in a particular embodiment). As a more specific example, when amplifier 100 has a fundamental frequency of operation, $f_0$, of about 2.15 gigahertz (GHz), and thus a $2f_0$ of about 4.3 GHz, the inductance and capacitance values of the components of the second resonator (i.e., inductive element 120 and capacitance 114) may have inductive and capacitive values, respectively, that result in the second resonator resonating at a frequency of about 2.93 GHz (i.e., a resonant frequency that is about 32 percent lower than $2f_0$).

Figures 7A, 7B:
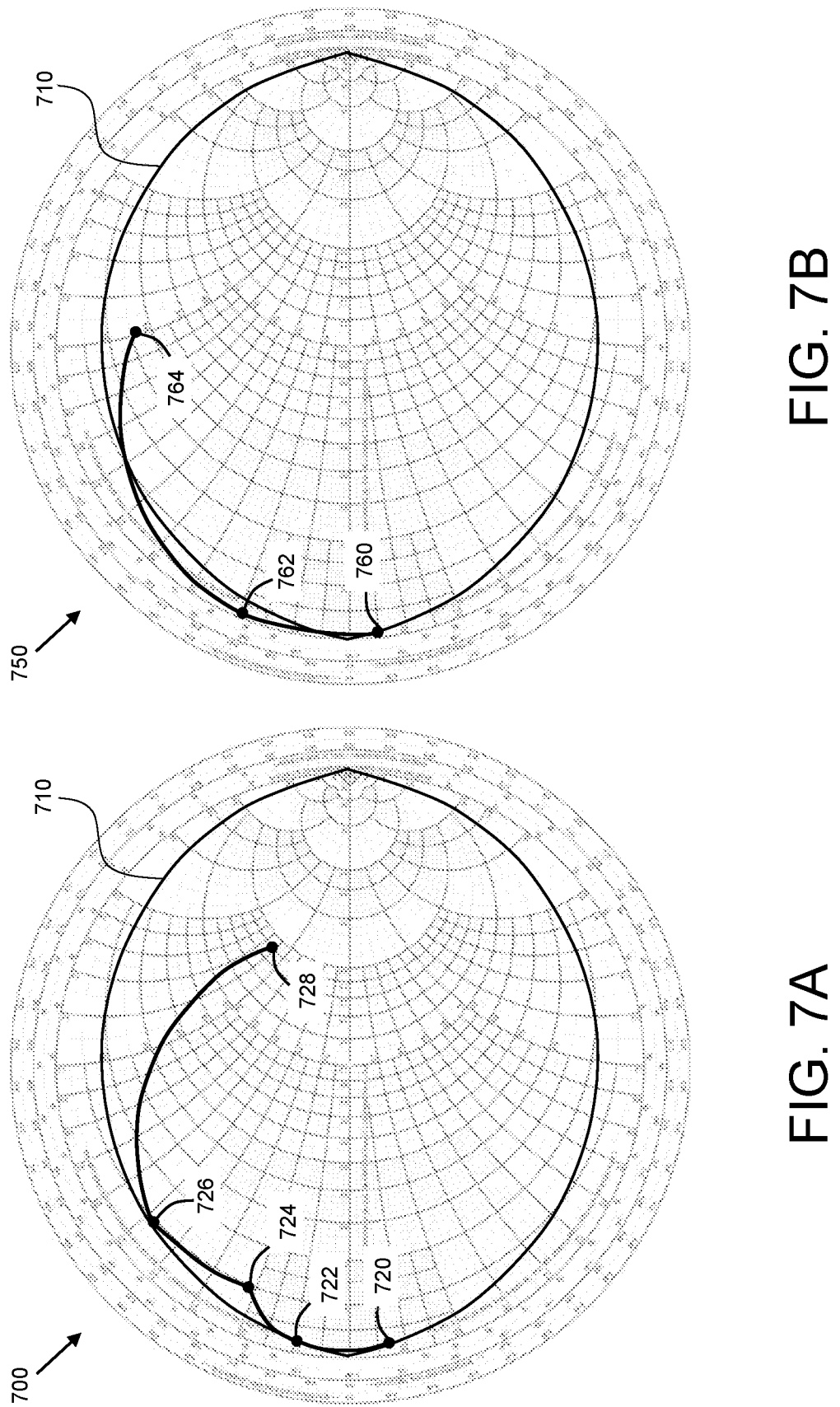
FIGS. 7A and 7B are Smith charts depicting fundamental frequency impedance transformations of amplifiers with and without the input impedance matching topology of the example embodiments of FIGS. 1 and 5.
Figure 7C:
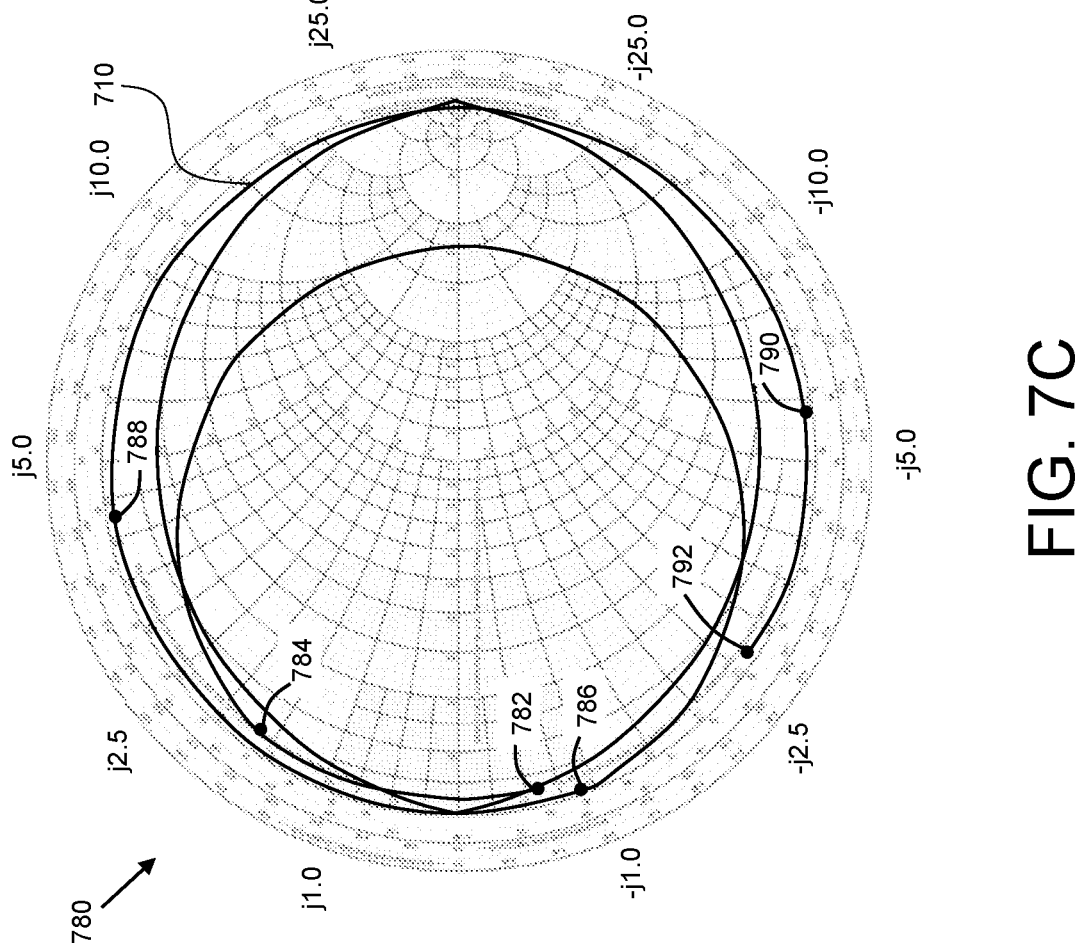
FIG. 7C is a Smith chart depicting the second harmonic frequency impedance transformation of an amplifier with the input impedance matching topology of the example embodiment of FIGS. 1 and 5.

According to a further embodiment, and as shown in FIG. 7C, described later, the impedance trajectory of the second resonator (i.e., elements 120, 114), along with contributions from the first resonator (i.e., elements 116, 118), enables the input impedance matching circuit 110 to target a $Zs\_2f_0\_extrinsic$ area around $j*X$, where $1.3<X<3.0$. Although not precisely tuned to resonate at the second harmonic frequency, the double T-match circuit 110 essentially performs the function of an input-side harmonic termination circuit. The double T-match configuration may result in a second resonator that is less sensitive to wirebond loop variations than an input harmonic termination circuit that includes an LC circuit that is configured to resonate at $2f_0$ (e.g., a conventional input harmonic termination circuit). In addition, the above-described configuration may ensure maximum P-3 dB power without compromising the drain efficiency. In addition, the double T-match circuit 110 functions as a broadband impedance transformer with a good Q factor, which may help to improve the dispersion of the input impedance over frequency, and thus also may improve the gain.

The various component values for amplifier 100 are selected depending on the fundamental frequency of operation, $f_0$, of the amplifier 100. For the component ranges disclosed herein, the fundamental frequency of amplifier 100 is assumed to be in a range of about 1.8 GHz to about 2.6 GHz. Those of skill in the art would understand, based on the description herein, how to adjust the component values for fundamental frequencies of operation that are lower (e.g., 800 megahertz (MHz) to 1.8 GHz) or higher (e.g., 2.6 GHz to 3.5 GHz or higher). According to an embodiment, inductive element 112 may have an inductance value in a range between about 50 picohenries (pH) to about 200 pH. Because inductive element 112 essentially is provided just to provide a connection to input 102, the value of element 112 is not crucial to circuit performance, and the value may be higher or lower than the above-given range. According to further embodiments, inductive element 116 may have an inductance value in a range between about 100 pH to about 300 pH, inductive element 120 may have an inductance value in a range between about 30 pH and about 200 pH, shunt capacitance 118 may have a capacitance value in a range between about 10 pF to about 40 pF, and shunt capacitance 114 may have a capacitance value in a range between about 60 pF to about 150 pF. In other embodiments, some or all of the above-listed components may have smaller or larger component values than the above-given ranges.

Desirably, shunt capacitance 114 has a relatively-large capacitance (e.g., greater than about 60 pF) to provide an RF low-impedance point at node 115. In other words, node 115 represents a low impedance point in the circuit for RF signals (also referred to as a "RF cold point"). According to an embodiment, a first (in-package) video bandwidth (VBW) circuit 160 is coupled between node 115 (e.g., or another RF low-impedance point at or coupled to node 115) and the ground reference node. The first video bandwidth circuit 160 may function to improve the low frequency resonance (LFR) of circuit 100 caused by the interaction between the input matching circuit 110 and the bias feeds (not shown) by presenting a low impedance at envelope frequencies and/or a high impedance at RF frequencies. The first video bandwidth circuit 160 essentially may be considered to be "invisible" from an RF matching standpoint, as it primarily affects the impedance at envelope frequencies (i.e., video bandwidth circuit 160 provides terminations for the envelope frequencies of circuit 100). As will be discussed in more detail later in conjunction with FIGS. 2A-2F, the first video bandwidth circuit 160 may have any of a number of different circuit configurations, in various embodiments.

Amplifier circuit 100 also may include gate terminal bias circuit 190 coupled to node 115, in an embodiment. The gate terminal bias circuit 190 also may function as an additional (out-of-package) video bandwidth circuit that is essentially coupled in parallel with the first video bandwidth circuit 160. Bias circuit 190 includes an inductive element 192 (e.g., one or more wirebonds 492, FIG. 4A), coupled in series with a bias lead 193 (e.g., lead 493, FIG. 4A) and capacitor 196 (e.g., capacitor 496, FIG. 4A). According to an embodiment, inductive element 192 may have an inductance value in a range between about 500 pH to about 1500 pH, and capacitor 196 may have a capacitance value in a range between about 8.0 microfarads (F) to about 12 µF (e.g., about 10 µF). although the inductance and/or capacitance values could be lower or higher, as well.

To provide a gate bias voltage to the gate terminal 142 of the transistor 140, an external bias circuit (not shown) may be connected to bias lead 193 (e.g., the distal end of bias lead 493 FIG. 4A), and the DC bias voltage may be provided through this lead. In another embodiment, the gate bias circuit 190 may be excluded. In such an embodiment, the external bias circuit may be connected instead to the input lead 102, and the DC gate bias voltage may be provided through the input lead 102.

On the output side of the circuit 100, output impedance matching circuit 150 is coupled between the first current conducting terminal 144 (e.g., drain terminal) of transistor 140 and the output lead 104. Output impedance matching circuit 150 is configured to match the output impedance of circuit 100 with the input impedance of an external circuit or component (not shown) that may be coupled to output lead 104. Output impedance matching circuit 150 may have any of a number of different circuit configurations, and just one example is shown in FIG. 1. More specifically, in the non-limiting example shown in FIG. 1, output impedance matching circuit 150 includes two inductive elements 152, 154 and shunt capacitance 156 (e.g., a DC blocking capacitor). A first inductive element 152 (e.g., a fourth set of wirebonds, FIG. 4A) is coupled between the first current conducting terminal 144 (e.g., drain terminal) of transistor 140 and the output lead 104. A second inductive element 154 (e.g., a fifth set of wirebonds, FIG. 4A) is coupled between the first current conducting terminal 144 of transistor 140 and a node 158, which corresponds to another RF low-impedance point (i.e., an RF cold point node), in an embodiment. A second terminal of the shunt capacitance 156 is coupled to ground (or to another voltage reference), in an embodiment. The inductive element 154 is coupled between terminal 144 of the transistor 140 in a shunt configuration, and thus may be referred to as a "shunt-L" circuit. This shunt-L circuit (including inductive element 154) is configured to improve the output impedance at the lead plane of the amplifier 100. In some embodiments, inductive element 154 may be implemented using a single inductive element (e.g., wirebonds 454, FIGS. 4A and 6). In another embodiment, as indicated in the callout box 153 shown above device 100, inductive element 154 alternatively may be implemented as two or more inductances 154', 154" coupled in series. For example, inductance 154' may be implemented as a set of wirebonds connected between the first current conducting terminal 144 of transistor 140 and an intermediate bondpad (e.g., a bondpad on IPD 483, 683, FIGS. 4A, 6), and inductance 154" may be implemented as another set of wirebonds (or an integrated spiral inductor or discrete inductor) connected between the intermediate bondpad and the first terminal of shunt capacitance 156. In callout box 153, the shunt capacitor shown to be coupled between the inductances 154', 154" and ground represents a small capacitance (e.g., 2 pF or less) associated with the intermediate bondpad. By splitting inductance 154 into two series inductances 154', 154", issues associated with longer wirebonds (e.g., wirebond heating issues) may be mitigated. According to an embodiment, inductive element 152 may have an inductance value in a range between about 100 pH to about 400 pH, and capacitance 156 may have a capacitance value in a range between about 78 pF to about 300 pF, although these components may have values outside of these ranges, as well. Desirably, the capacitance value of capacitance 156 should be at least 10 times greater than the parasitic output capacitance 146 of transistor 140.

Again, the RF low-impedance point 158 represents a low impedance point in the circuit for RF signals. According to an embodiment, another video bandwidth circuit 162 is coupled between the RF low-impedance point 158 and the ground reference node. Again, video bandwidth circuit 162 may function to further improve the LFR of circuit 100 caused by the interaction between the output impedance matching circuit 150 and the bias feeds (not shown) by presenting a low impedance at envelope frequencies and/or a high impedance at RF frequencies. Video bandwidth circuit 162 also may be considered to be "invisible" from an RF matching standpoint.

According to an embodiment, a second harmonic termination circuit 170 (or "series LC resonator circuit") is coupled between output lead 104 and ground (or another voltage reference). According to an embodiment, the second harmonic termination circuit 170 is directly connected to the output lead 104. Essentially, the second harmonic termination circuit 170 is a series LC resonator circuit, which resonates at the second harmonic frequency to provide a short circuit to ground at the second harmonic frequency, which is transformed through inductance 152 to an open circuit at the current source (e.g., drain terminal 144) of the power transistor 140. In other words, at the output lead 104, circuit 170 operates as a short circuit (to ground) for signal energy at the second harmonic frequency, $2f_0$, relative to the Ropt value, which is linked to the gate periphery and the semiconductor technology of transistor 140. Because circuit 170 is connected directly to the output lead 104, amplifier 100 is less sensitive to second harmonic load conditions at the output lead 104 (i.e., second harmonic load from a PCB to which amplifier 100 is connected). The circuitry between transistor 140 and the harmonic termination circuit 170 (i.e., inductors 152, 154, capacitor 156, and parasitic capacitance 146) bring the short at the second harmonic frequency provided by circuit 170 to a capacitive open (relative to Ropt) at the second harmonic frequency as seen by the drain terminal 144 of transistor 140. Amplifier 100 may be considered to be a "pseudo" inverse class F amplifier, because the second harmonic impedance, $Z1\_2f_0$, at the drain terminal 144 is not a strict open circuit, which could result in an undesirably high voltage swing.

Harmonic termination circuit 170 includes inductive element 172 (e.g., a sixth set of wirebonds, FIG. 4A) and capacitance 176 coupled in series between the output lead 104 and ground (or another voltage reference), and this series combination of elements functions as a low impedance path to ground for signal energy at a harmonic frequency (e.g., a second harmonic of a fundamental frequency of operation of circuit 100). According to an embodiment, inductive element 172 may have an inductance value in a range between about 100 pH to about 500 pH, and capacitance 176 may have a capacitance value in a range between about 4 pF to about 15 pF, although these components may have values outside of these ranges, as well. For example, at an example fundamental frequency of operation of 2.0 gigahertz (GHz), which has a second harmonic frequency at 4.0 GHz, inductive element 172 may have an inductance value of about 120 pH, and capacitance 176 may have a capacitance value of about 12 pF to appropriately resonate at the second harmonic frequency.

Amplifier circuit 100 also may include drain terminal bias circuit 191 coupled to node 158, in an embodiment. The drain terminal bias circuit 191 may function as another additional (out-of-package) video bandwidth circuit that is essentially coupled in parallel with the second video bandwidth circuit 162. Bias circuit 191 includes an inductive element 194 (e.g., one or more wirebonds 494, FIG. 4A), coupled in series with a bias lead 495, FIG. 4A) and capacitor 198 (e.g., capacitor 498, FIG. 4A). According to an embodiment, inductive element 194 may have an inductance value in a range between about 500 pH to about 1500 pH, and capacitor 198 may have a capacitance value in a range between about 8.0 µF to about 12 µF (e.g., about 10 µF), although the inductance and/or capacitance values could be lower or higher, as well.

To provide a drain bias voltage to the drain terminal 144 of the transistor 140, an external bias circuit (not shown) may be connected to bias lead 195 (e.g., the distal end of bias lead 495, FIG. 4A), and the DC bias voltage may be provided through this node. In another embodiment, the drain bias circuit 191 may be excluded. In such an embodiment, the external bias circuit may be connected instead to the output lead 104, and the DC drain bias voltage may be provided through the output lead 104.

As will now be described in conjunction with FIGS. 2A-2F, the video bandwidth circuits 160, 162 may have any of a number of different circuit configurations, in various embodiments. For example, FIGS. 2A-2F illustrate six example embodiments of video bandwidth circuits (e.g., video bandwidth circuits 160, 162, FIG. 1). In each of FIGS. 2A-2F, video bandwidth circuit 200, 201, 202, 203, 204, 205 is coupled between a connection node 215 (e.g., node 115 and/or node 158, FIG. 1) and ground (or another voltage reference). Further, each video bandwidth circuit 200-205 includes an envelope inductance 262, $L_{env}$, an envelope resistor 264, $R_{env}$, and an envelope capacitor 266, $C_{env}$, coupled in series between the connection node 215 and ground. In each of FIGS. 2A-2E, a first terminal of envelope inductance 262 is coupled to node 215, and a second terminal of envelope inductance 262 is coupled to node 280. A first terminal of envelope resistor 264 is coupled to node 280, and a second terminal of envelope resistor 264 is coupled to node 282. A first terminal of envelope capacitor 266 is coupled to node 282, and a second terminal of the envelope capacitor 266 is coupled to ground (or another voltage reference). Although the order of the series of components between node 215 and the ground reference node is the envelope inductance 262, the envelope resistor 264, and the envelope capacitor 266 in FIGS. 2A-2E, the order of components in the series circuit could be different, in other embodiments. For example, in FIG. 2F, the envelope resistor 264 is coupled between node 215 and a node 284, the envelope inductance 262 is coupled between node 284 and a node 286, and the envelope capacitor 266 is coupled between node 286 and ground (or another voltage reference).

Referring to FIGS. 2A-2F, and according to an embodiment, the envelope inductance 262, may be implemented as an integrated inductance (e.g., inductance 462, FIGS. 4B, 4C), as a discrete inductor, and/or as a set of wirebonds coupling the connection node 215 to the envelope resistor 264 (e.g., via node 280). For example, and as will be described in detail later, envelope inductance 262 may be integrally formed as a portion of an integrated passive device (IPD), such as any or all of IPDs 480-483, 682, 683, FIGS. 4A-C, 6. For example, envelope inductance 262 may have an inductance value in a range between about 5 pH to about 2000 pH. Desirably, envelope inductance 262 has an inductance value less than about 500 pH (e.g., as low as 50 pH, in an embodiment, or possibly even lower). In other embodiments, the value of envelope inductance 262 may be lower or higher than the above-given range.

Envelope resistor 264 may be implemented as an integrated resistor (e.g., resistor 464, FIGS. 4B, 4C), in an embodiment, or as a discrete resistor, in another embodiment. For example, envelope resistor 264 may be integrally formed as a portion of an IPD, such as any or all of IPDs 480-483, 682, 683, FIGS. 4A-C, 6. In some instances, envelope capacitor 266 and envelope inductor 262 may provide additional parasitic resistance which can be considered part of the overall resistance that forms envelope resistor 264. In an embodiment, envelope resistor 264 may have a resistance value in a range between about 0.1 ohm to about 5.0 ohm, although envelope resistor 264 may have a resistance value outside of this range, as well.

Envelope capacitor 266 may be implemented as an integrated capacitor (e.g., capacitor 466, FIGS. 4B, 4C), in an embodiment, or as a discrete capacitor (e.g., a "chip capacitor"), in another embodiment. For example, envelope capacitor 266 may be integrally formed as a portion of an IPD, such as any or all of IPDs 480-483, 682, 683, FIGS. 4A-C, 6. In an embodiment, envelope capacitor 266 may have a capacitance value in a range between about 1 nF to about 1 microfarad (µF), although envelope capacitor 266 may have a capacitance value outside of this range, as well.

Figures 2A, 2B, 2C, 2D, 2E, 2F:
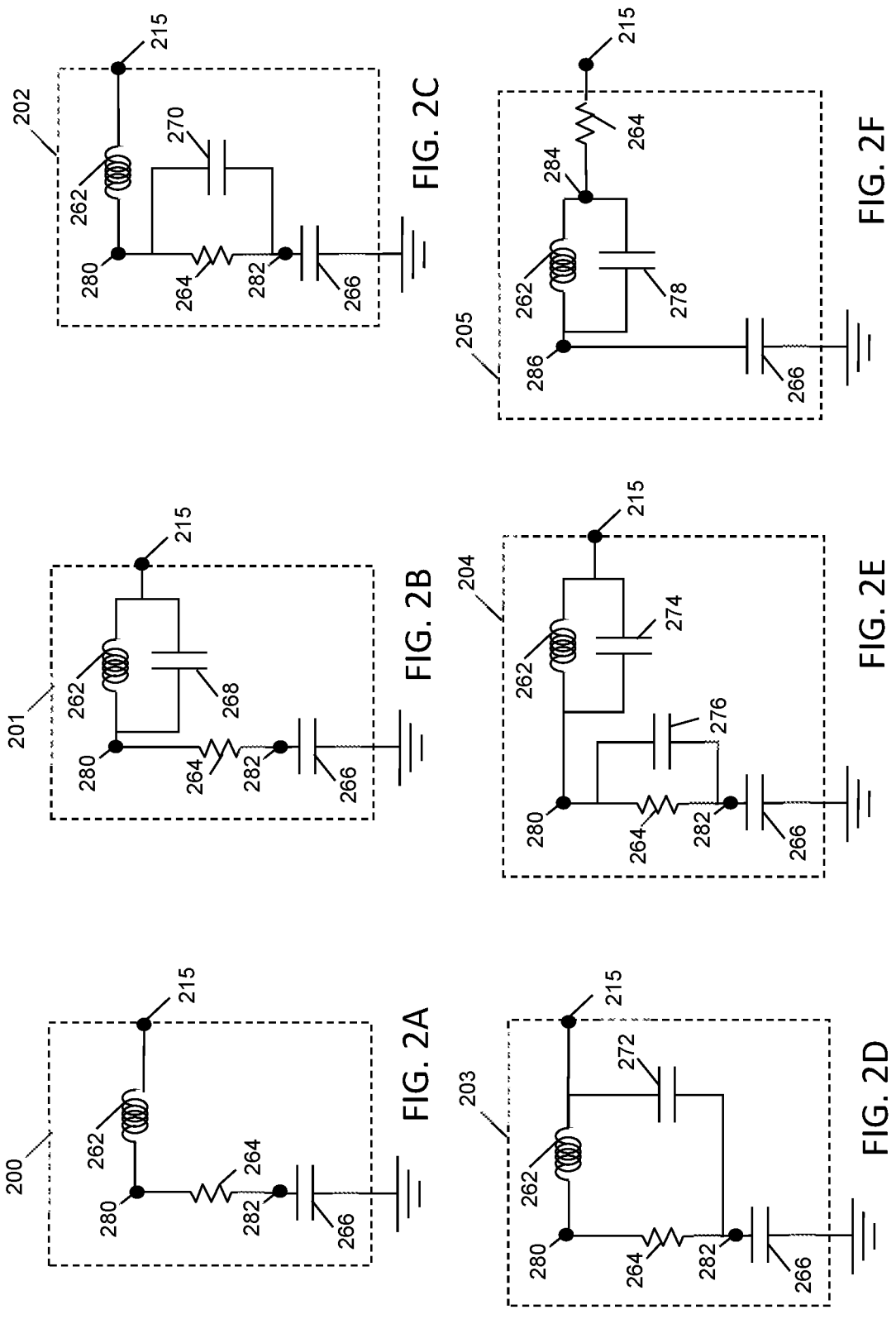
FIGS. 2A-2F illustrate various example embodiments of video bandwidth circuits.

The first embodiment of video bandwidth circuit 200 illustrated in FIG. 2A includes a simple series combination of envelope inductance 262, envelope resistor 264, and envelope capacitor 266. Conversely, in the embodiments of FIGS. 2B-2F, the video bandwidth circuit 201-205 may include one or more "bypass" or "parallel" capacitors 268, 270, 272, 274, 276, 278, $C_{para}$, which are coupled in parallel with the envelope inductance 262 and/or the envelope resistor 264. Each of the bypass capacitors 268, 270, 272, 274, 276, 278 may be implemented as a discrete capacitor (e.g., capacitor 478, FIGS. 4B, 4C), in some embodiments, or as an integrated capacitor, in other embodiments. In each of these embodiments, a bypass capacitor 268, 270, 272, 274, 276, 278 may have a capacitance value in a range between about 33 pF to about 37 pF. In other embodiments, the value of any of bypass capacitors 268, 270, 272, 274, 276, 278 may be lower or higher than the above-given range.

In the video bandwidth circuit 201 of FIG. 2B, bypass capacitor 268, $C_{para}$, is coupled in parallel with the envelope inductance 262. More specifically, first terminals of envelope inductance 262 and bypass capacitor 268 are coupled to node 215, and second terminals of envelope inductance 262 and bypass capacitor 268 are coupled to node 280.

In the video bandwidth circuit 202 of FIG. 2C, bypass capacitor 270, $C_{para}$, is coupled in parallel with the envelope resistor 264. More specifically, first terminals of envelope resistor 264 and bypass capacitor 270 are coupled to node 280, and second terminals of envelope resistor 264 and bypass capacitor 270 are coupled to node 282.

In the video bandwidth circuit 203 of FIG. 2D, bypass capacitor 272, $C_{para}$, is coupled in parallel with the envelope inductance 262 and envelope resistor 264. More specifically, bypass capacitor 272 is coupled across nodes 215 and 282.

In the video bandwidth circuit 204 of FIG. 2E, a first bypass capacitor 274, $C_{para1}$, is coupled in parallel with the envelope inductance 262, and a second bypass capacitor 276, $C_{para2}$, is coupled in parallel with the envelope resistor 264. More specifically, first terminals of envelope inductance 262 and first bypass capacitor 274 are coupled to node 215, and second terminals of envelope inductance 262 and first bypass capacitor 274 are coupled to node 280. In addition, first terminals of envelope resistor 264 and second bypass capacitor 276 are coupled to node 280, and second terminals of envelope resistor 264 and second bypass capacitor 276 are coupled to node 282.

Referring to the video bandwidth circuits 201, 204, and 205 of FIGS. 2B, 2E, and 2F, parallel-coupled inductance 262 and capacitor 268, 274 or 278 form a parallel resonant circuit at frequencies in proximity to the center operational frequency of the device or circuit (e.g., circuit 100 or 500, FIGS. 1, 5) within which circuit 201, 204 or 205 is incorporated. As used herein, and according to an embodiment, the term "in proximity to the center operating frequency" means "within 20 percent of the center operating frequency." Accordingly, for example, when a device has a center operating frequency of 2.0 GHz, a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because $L_{env}//C_{para}$ form a parallel resonant circuit at frequencies in proximity to the center operational frequency of the device, the parallel resonant circuit $L_{env}//C_{para}$ essentially appears as an open circuit to such frequencies. Accordingly, RF energy near the center operational frequency that may be present at the node 215 to which circuit 201, 204 or 205 is coupled will be deflected by the parallel resonant circuit $L_{env}//C_{para}$. This deflection may be provided even using a relatively low inductance value for inductance 262. For these reasons, circuits 201, 204, and 205 may significantly improve the LFR of a device or circuit (e.g., circuit 100) in which it is incorporated by presenting a low impedance at envelope frequencies and a high impedance at RF frequencies.

In each of the embodiments of video bandwidth circuits 202, 203, 204 of FIGS. 2C, 2D, and 2E, bypass capacitor 270, 272 or 276 is coupled in parallel with envelope resistor 264. Because capacitor 270, 272 or 276 may function to route RF current around the envelope resistor 264, circuits 202, 203, 204 may result in a reduction in the RF current dissipated by the envelope resistor 264. This characteristic of circuits 202, 203, 204 also may serve to better protect the envelope resistor 264 from potential compromise due to excessive current that may otherwise flow through the envelope resistor 264 in the absence of bypass capacitor 270, 272 or 276.

Each of circuits 201-205 may increase the device efficiency, when compared with circuit 200, since they allow less RF current to flow through (and be dissipated by) the envelope resistor 264. Further, because circuits 201-205 present a high impedance to RF frequencies in proximity to the center operational frequency of a device into which the video bandwidth circuit is incorporated, it is not as important for circuits 201-205 to be connected to an RF low-impedance point (e.g., RF low-impedance point 115 or 158, FIGS. 1, 5), although they may be. Instead, the benefits of circuits 201-205 may be achieved even when circuits 201-205 are coupled to a node that shows higher RF impedance. This includes other nodes in both the input and output impedance matching circuits.

Referring again to FIG. 1, and as will be described in more detail later in conjunction with FIGS. 4A-C, various embodiments of RF amplifier devices may include at least one input-side integrated passive device (IPD) assembly (e.g., IPD assemblies 480, 481, FIGS. 4A-C), and at least one output-side IPD assembly (e.g., IPD assemblies 482, 483, FIG. 4A). The input-side IPD assembly(ies) (e.g., IPD assemblies 480, 481) include portions of the input circuit 110 and the video bandwidth circuit 160. Similarly, the output-side IPD assembly(ies) (e.g., IPD assemblies 482, 483) include portions of the output circuit 150, the video bandwidth circuit 162, and the harmonic termination circuit 170. More specifically, each IPD assembly may include a semiconductor substrate with one or more integrated passive components. In a particular embodiment, each input-side IPD assembly may include shunt capacitances 114 and 118, and components of video bandwidth circuit 160 (e.g., components 262, 264, 266, 268, 270, 272, 274, 276, 278, FIGS. 2A-2F). In other particular embodiments, each output-side IPD assembly may include capacitances 156 and 176, and components of video bandwidth circuit 162 (e.g., components 262, 264, 266, 268, 270, 272, 274, 276, 278, FIGS. 2A-2F).

In other embodiments, some portions of the input and output impedance matching circuits 110, 150, video bandwidth circuits 160, 162, and harmonic termination circuit 170 may be implemented as distinct/discrete components or as portions of other types of assemblies (e.g., a low-temperature co-fired ceramic (LTCC) device, a small PCB assembly, and so on). In still other embodiments, some portions of the input and/or output impedance matching circuits 110, 150 may be coupled to and/or integrated within the semiconductor die that includes transistor 140. The below, detailed description of embodiments that include IPD assemblies should not be taken to limit the inventive subject matter, and the term "passive device substrate" or "IPD substrate" means any type of structure that includes a passive device, including an IPD, a LTCC device, a transistor die, a PCB assembly, and so on.

The RF amplifier circuit 100 of FIG. 1 may be utilized as a single-path amplifier, which receives an RF signal at input lead 102, amplifies the signal through transistor 140, and produces an amplified RF signal at output lead 104. Alternatively, multiple instances of the RF amplifier circuit 100 may be utilized to provide a multiple-path amplifier, such as a Doherty power amplifier or another type of multi-path amplifier circuit. In still other alternative arrangements, the RF amplifier circuit 100 of FIG. 1 may be utilized in one path of a Doherty power amplifier (e.g., in the peaking amplifier path), and an alternate amplifier configuration may be utilized in the other path of the Doherty power amplifier (e.g., in the carrier amplifier path).

Figure 3:
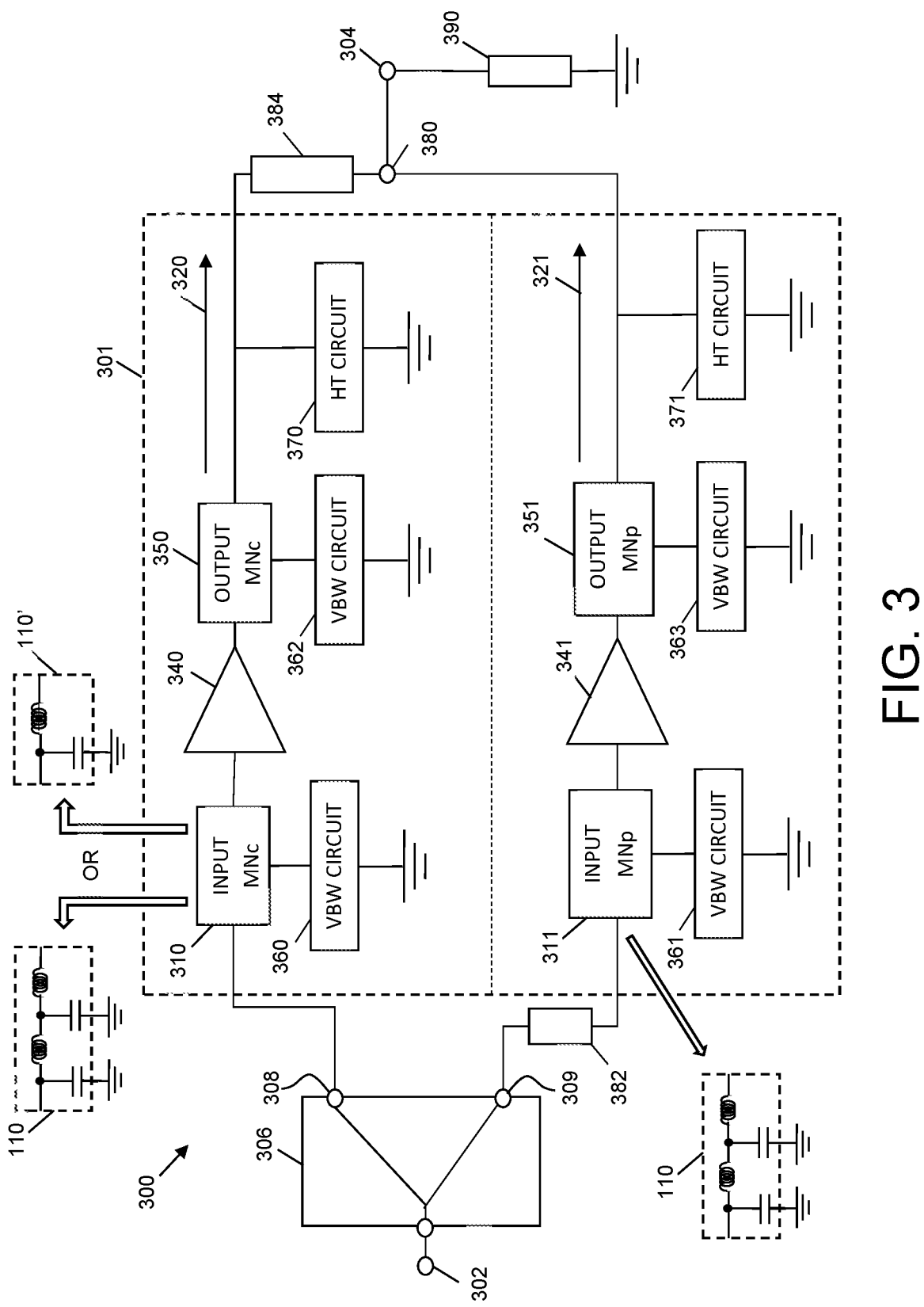
FIG. 3 is a simplified schematic diagram of a Doherty power amplifier, in accordance with an example embodiment.

For example, FIG. 3 is a simplified schematic diagram of a Doherty power amplifier 300 in which embodiments of RF power amplifier circuit 100 may be implemented. Amplifier 300 includes an input node 302, an output node 304, a power divider 306 (or splitter), a carrier amplifier path 320, a peaking amplifier path 321, and a combining node 380. A load 390 may be coupled to the combining node 380 (e.g., through an impedance transformer, not shown) to receive an amplified RF signal from amplifier 300.

Power divider 306 is configured to divide the power of an input RF signal received at input node 302 into carrier and peaking portions of the input signal. The carrier input signal is provided to the carrier amplifier path 320 at power divider output 308, and the peaking input signal is provided to the peaking amplifier path 321 at power divider output 309. During operation in a full-power mode when both the carrier and peaking amplifiers 340, 341 are supplying current to the load 390, the power divider 306 divides the input signal power between the amplifier paths 320, 321. For example, the power divider 306 may divide the power equally, such that roughly one half of the input signal power is provided to each path 320, 321 (e.g., for a symmetric Doherty amplifier configuration). Alternatively, the power divider 306 may divide the power unequally (e.g., for an asymmetric Doherty amplifier configuration).

Essentially, the power divider 306 divides an input RF signal supplied at the input node 302, and the divided signals are separately amplified along the carrier and peaking amplifier paths 320, 321. The amplified signals are then combined in phase at the combining node 380. It is important that phase coherency between the carrier and peaking amplifier paths 320, 321 is maintained across a frequency band of interest to ensure that the amplified carrier and peaking signals arrive in phase at the combining node 380, and thus to ensure proper Doherty amplifier operation.

Dashed box 301 encompasses components of the carrier and peaking amplifier paths 320, 321 that are incorporated into a single packaged power amplifier device (e.g., device 400 or 600, FIGS. 4A, 6), according to an embodiment. In an alternate embodiment, as indicated by the horizontal dividing line through box 301, components of the carrier amplifier path 320 may be incorporated into a first packaged power amplifier device, and components of the peaking amplifier path 321 may be incorporated into a second packaged power amplifier device.

Either way, each of the carrier amplifier 340 and the peaking amplifier 341 includes one or more single-stage or multiple-stage power transistor integrated circuits (ICs) (or power transistor die, such as dies 440, 441, FIGS. 4A, 6) for amplifying an RF signal conducted through the amplifier 340, 341. According to various embodiments, all amplifier stages or a final amplifier stage of either or both the carrier amplifier 340 and/or the peaking amplifier 341 may be implemented, for example, using a III-V field effect transistor (e.g., a HEMT), such as a GaN FET (or another type of III-V transistor, including a GaAs FET, a GaP FET, an InP FET, or an InSb FET). Where only one of the carrier amplifier 340 or the peaking amplifier 341 is implemented as a III-V FET, the other amplifier may be implemented as a silicon-based FET (e.g., an LDMOS FET), in some embodiments.

Although the carrier and peaking power transistor ICs may be of equal periphery/size (e.g., in a symmetric Doherty configuration), the carrier and peaking power transistor ICs may have unequal peripheries/sizes, as well (e.g., in various asymmetric Doherty configurations). In an asymmetric Doherty configuration, the peaking power transistor IC(s) typically are larger than the carrier power transistor IC(s) by some multiplier. For example, the peaking power transistor IC(s) may be twice the size of the carrier power transistor IC(s) so that the peaking power transistor IC(s) have twice the current carrying capability of the carrier power transistor IC(s). Peaking-to-carrier amplifier IC size ratios other than a 2:1 ratio may be implemented, as well.

During operation of Doherty amplifier 300, the carrier amplifier 340 is biased to operate in class AB mode, and the peaking amplifier 341 is biased to operate in class C mode. At low power levels, where the power of the input signal at node 302 is lower than the turn-on threshold level of peaking amplifier 341, the amplifier 300 operates in a low-power (or back-off) mode in which the carrier amplifier 340 is the only amplifier supplying current to the load 390. When the power of the input signal exceeds a threshold level of the peaking amplifier 341, the amplifier 300 operates in a high-power mode in which the carrier amplifier 340 and the peaking amplifier 341 both supply current to the load 390. At this point, the peaking amplifier 341 provides active load modulation at combining node 380, allowing the current of the carrier amplifier 340 to continue to increase linearly.

Input and output impedance matching networks 310, 350 (input MNc, output MNc) are implemented at the input and/or output of the carrier amplifier 340. Similarly, input and output impedance matching networks 311, 351 (input MNp, output MNp) are implemented at the input and/or output of the peaking amplifier 341. In each case, the matching networks 310, 311, 350, 351 may be used to transform the gate and drain impedances of carrier amplifier 340 and peaking amplifier 341 to a more desirable system level impedance, as well as manipulate the signal phases to ensure proper Doherty amplifier operation. The input and output impedance matching networks 310, 311, 350, 351 are implemented inside a power transistor package that includes the carrier and/or peaking amplifiers 340, 341 (as indicated by box 301). In some embodiments, additional matching components may be implemented outside the power transistor package on a PCB or other substrate to which a power transistor package is mounted.

According to one embodiment, the carrier and peaking paths 320, 321 have a substantially identical circuit configuration (e.g., each path 320, 321 is configured to be substantially identical to amplifier 100 or 500, FIGS. 1, 5). In such an embodiment, the input impedance matching networks 310, 311 each may have the double T-match configuration of input matching network 110 (FIGS. 1, 5), as indicated in dashed boxes pointed to by arrows proximate to networks 310, 311 in FIG. 3.

In an alternate embodiment, and particularly in an embodiment in which the Doherty amplifier is an asymmetric Doherty amplifier, the carrier and peaking paths 320, 321 may have different circuit configurations. For example, in an asymmetric Doherty amplifier embodiment in which the peaking amplifier transistor periphery is significantly larger than the carrier amplifier transistor periphery (e.g., twice as large), the input impedance matching network 311 of the peaking amplifier path 321 may have the double T-match configuration of input matching network 110 (FIG. 1) to compensate for the larger $C_{ds}$ of the peaking amplifier transistor, while the input impedance matching network 310 of the carrier amplifier path 320 may have a different configuration. For example, the input impedance matching network 310 of the carrier amplifier path 320 may have a single T-match configuration 110', as indicated in a dashed box pointed to by an arrow proximate to network 310 in FIG. 3. Alternatively, the input impedance matching network 310 may have some other configuration that differs from input matching network 110 or 110' (e.g., a PI network, a bandpass filter network, or some other configuration).

According to an embodiment, a video bandwidth circuit 360, 361, 362, 363 (e.g., circuits 160, 162, FIG. 1) is coupled to each of the input and output matching networks 310, 311, 350, 351 (e.g., to an RF cold point node of each network 310, 311, 350, 351). In addition, according to an embodiment, each of the carrier and peaking amplifier paths 320, 321 may include a harmonic frequency termination (HT) circuit 370, 371 (e.g., circuit 170, FIG. 1) coupled between the outputs of amplifiers 340, 341 and a ground reference. For example, the harmonic frequency termination circuits 370, 371 may provide a low impedance path to ground for signal energy at the second harmonic frequency. The harmonic frequency termination circuits 370, 371 are configured to control the harmonic impedance across a relatively wide fractional bandwidth.

Doherty amplifier 300 has a "non-inverted" load network configuration. In the non-inverted configuration, the input circuit is configured so that an input signal supplied to the peaking amplifier 341 is delayed by 90 degrees with respect to the input signal supplied to the carrier amplifier 340 at the center frequency of operation, $f_0$, of the amplifier 300. Essentially, this phase delay is intended to compensate for a 90 degree phase delay applied at the output of the carrier amplifier 340, as described below. To provide the input-side phase delay, phase delay element 382 applies about 90 degrees of phase delay to the peaking input signal so that the carrier and peaking input RF signals arrive at the inputs to the carrier and peaking amplifiers 340, 341 with about 90 degrees of phase difference. For example, phase delay element 382 may include a quarter wave transmission line on a PCB to which device 301 is coupled, or another suitable type of delay element with an electrical length of about 90 degrees.

As indicated above, the output circuit is configured to apply about a 90 degree phase delay to the signal between the output of carrier amplifier 340 and the combining node 380, which ensures that the amplified signals from the carrier and peaking amplifiers 340, 341 arrive in phase at the combining node 380. This output-side phase delay is achieved through an additional delay element 384 (e.g., another quarter wave transmission line on the PCB).

Alternate embodiments of Doherty amplifiers may have an "inverted" load network configuration. In such a configuration, the input circuit is configured so that an input signal supplied to the carrier amplifier 340 is delayed by about 90 degrees with respect to the input signal supplied to the peaking amplifier 341 at the center frequency of operation, $f_0$, of the amplifier 300, and the output circuit is configured to apply about a 90 degree phase delay to the signal between the output of peaking amplifier 341 and the combining node 380.

Amplifiers 340 and 341, along with video bandwidth circuits 360-363, harmonic frequency termination circuits 370, 371, and portions of matching networks 310, 311, 350, 351 may be implemented in discrete, packaged power amplifier devices. In such devices, input and output leads are coupled to a device substrate, and each amplifier 340, 341 may include a single-stage or multi-stage power transistor also coupled to the device substrate. Portions of the video bandwidth circuits 360-363, harmonic frequency termination circuits 370, 371 and the input and output matching networks 310, 311, 350, 351 may be implemented as additional components within the packaged device.

Figure 4A:
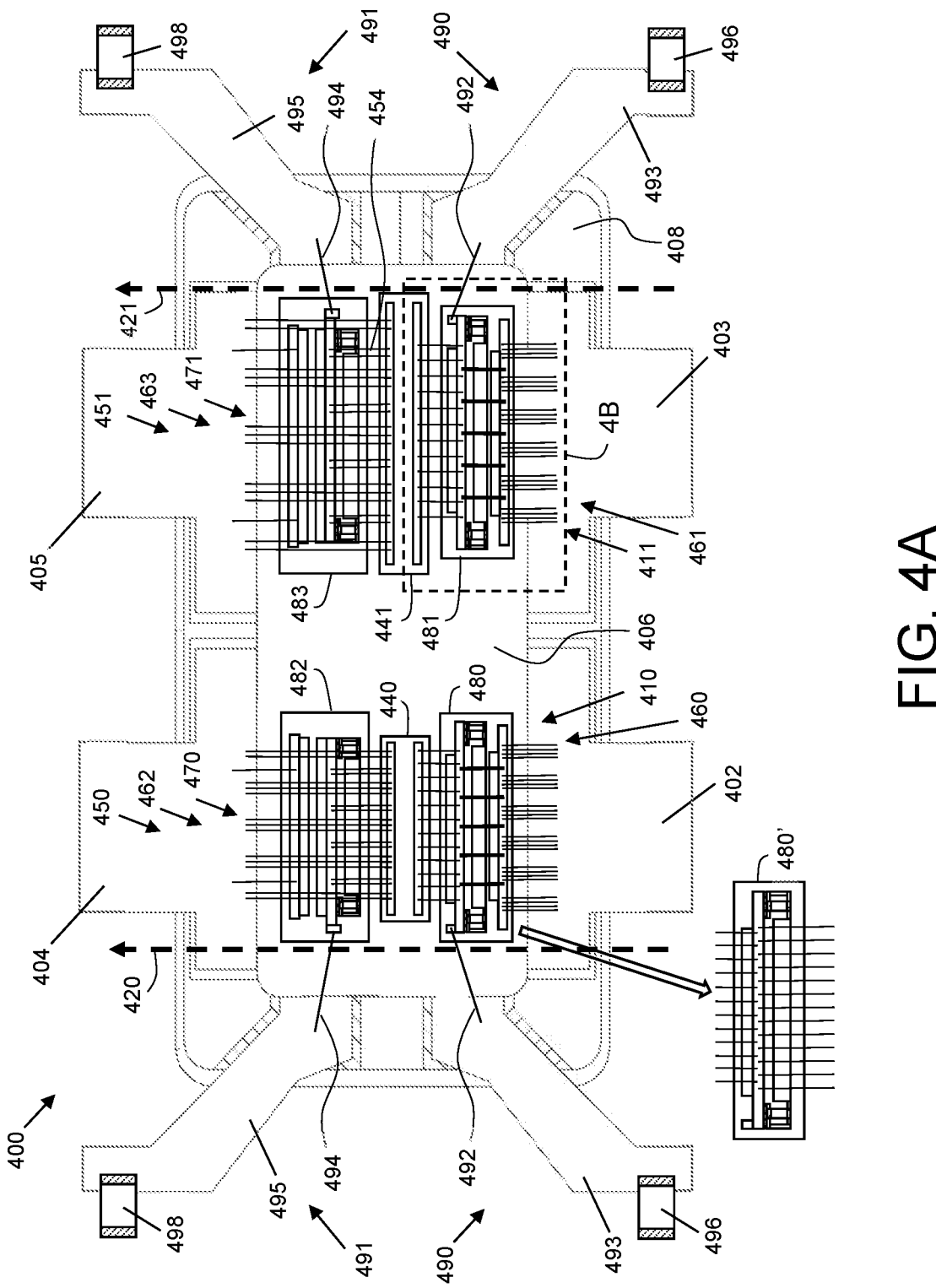
FIG. 4A is a top view of a packaged RF power amplifier device, in accordance with an example embodiment.

For example, FIG. 4A is a top view of an embodiment of a packaged RF amplifier device 400 that embodies two parallel instances of the circuit 100 of FIG. 1, and which may be utilized to provide amplifiers (e.g., amplifiers 340, 341, FIG. 3), and portions of matching networks (e.g., portions of matching networks 310, 311, 350, 351, FIG. 3) in a Doherty amplifier (e.g., Doherty amplifier 300, FIG. 3). For enhanced understanding, FIG. 4A should be viewed in conjunction with FIGS. 4B and 4C, which illustrate top and side, cross-sectional views of a portion of amplifier 400 that is encompassed by box 4B in FIG. 4A. This portion of amplifier 400 corresponds to the input side of the peaking amplifier path 421.

Device 400 includes two input-side IPD assemblies 480, 481, each of which includes portions of an input impedance matching circuit 410, 411 (e.g., circuit 110, 310, 311 FIGS. 1, 3), and a video bandwidth circuit 460, 461 (e.g., circuit 160, 360, 361, FIGS. 1, 3). Further, device 400 includes two output-side IPD assemblies 482, 483, each of which includes portions of an output impedance matching circuit 450, 451 (e.g., circuit 150, 350, 351 FIGS. 1, 3), a video bandwidth circuit 462, 463 (e.g., circuit 162, 362, 363, FIGS. 1, 3) and a harmonic termination circuit 470, 471 (e.g., circuit 170, 370, 371, FIGS. 1, 3).

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for transistor dies 440, 441 and other devices mounted on flange 406. As best shown in FIG. 4C, flange 406 has top and bottom surfaces (only a central portion of the top surface is visible in FIG. 4A), and a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system (e.g., coupled to a PCB). At least the top surface of flange 406 is formed from a layer of conductive material, and possibly all of flange 406 is formed from bulk conductive material.

Figure 4B:
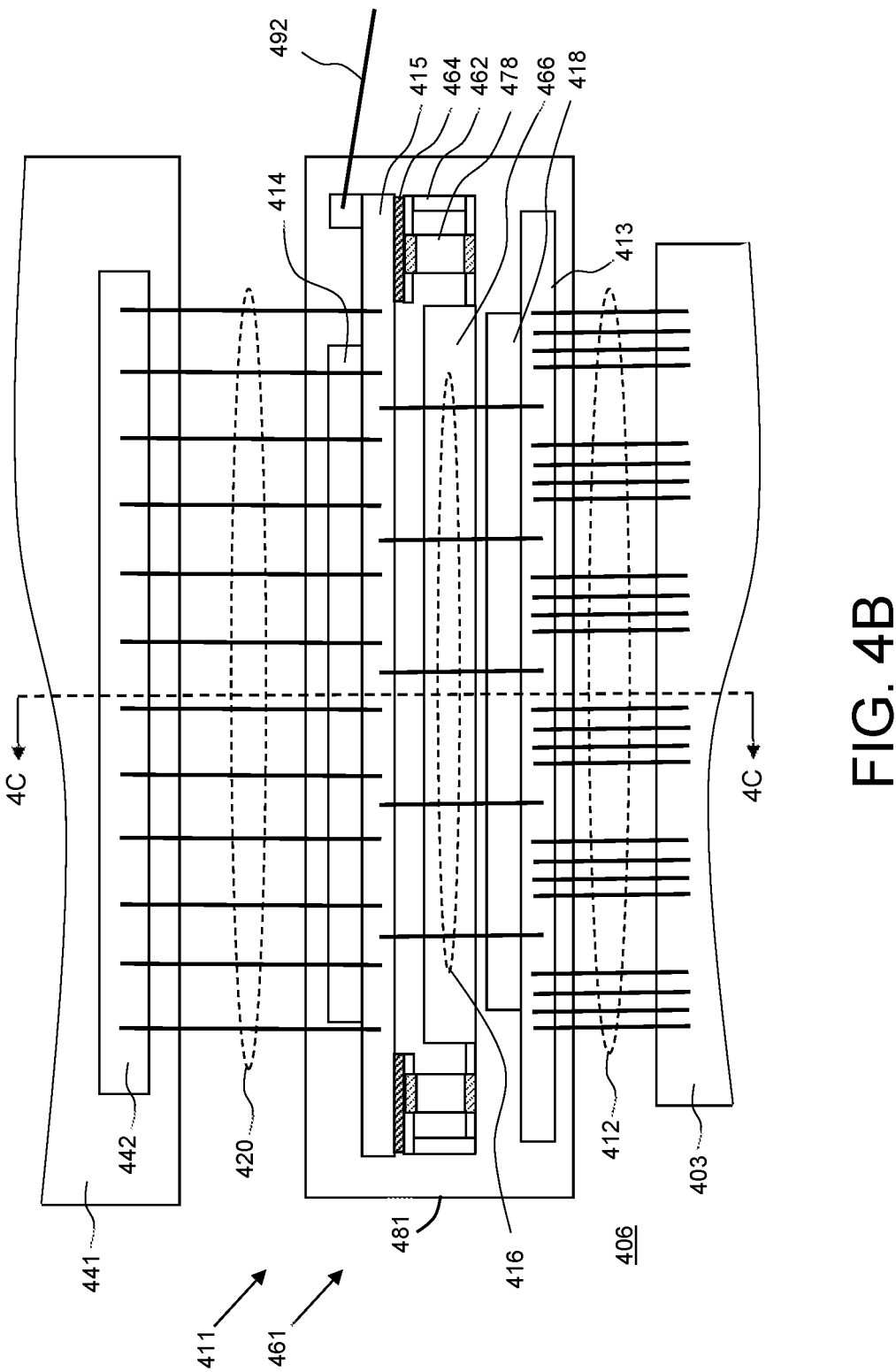
FIG. 4B is an enlarged view of a portion of the packaged RF power amplifier of FIG. 4A enclosed by box 4B.
Figure 4C:
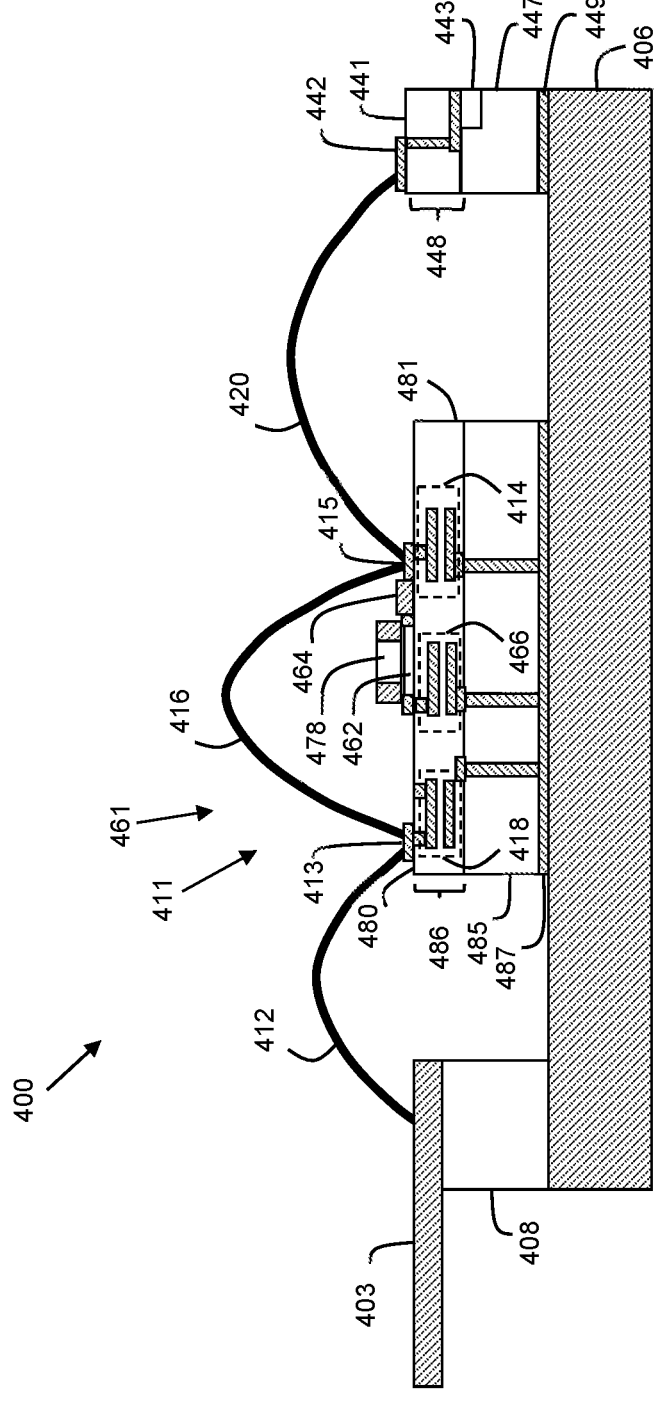
FIG. 4C is a cross-sectional view of the enlarged portion of the packaged RF power amplifier device of FIG. 4B along line 4C-4C.

As best seen in FIG. 4C, an isolation structure 408 is attached to the top surface of flange 406, in an embodiment. Isolation structure 408, which is formed from a rigid, electrically insulating material, provides electrical isolation between conductive features of the device (e.g., between leads 402-405, 492-495 and flange 406). Viewed from the top as in FIG. 4A, isolation structure 408 may have a frame shape, which includes a substantially enclosed, four-sided structure with a central opening. Isolation structure 408 may have a substantially rectangular shape, as shown in FIG. 4A, or isolation structure 408 may have another shape (e.g., annular ring, oval, and so on).

A portion of the top surface of flange 406 that is exposed through the opening in isolation structure 408 is referred to herein as the "active area" of device 400. Transistor dies 440, 441 are positioned within the active device area of device 400, along with IPD assemblies 480, 481, 482, 483, which will be described in more detail later. For example, the transistor dies 440, 441 and IPD assemblies 480-483 may be coupled to the top surface of flange 406 using conductive epoxy, solder, solder bumps, sintering, and/or eutectic bonds.

Device 400 houses two amplification paths (indicated with arrows 420, 421), where each amplification path 420, 421 represents a physical implementation of circuit 100 (FIG. 1). When incorporated into a Doherty amplifier (e.g., Doherty amplifier 300, FIG. 3), amplification path 420 may correspond to a carrier amplifier path (e.g., carrier amplifier path 320, FIG. 3), and amplification path 421 may correspond to a peaking amplifier path (e.g., peaking amplifier path 321, FIG. 3).

Each path 420, 421 includes an input lead 402, 403 (e.g., input lead 102, FIG. 1), an output lead 404, 405 (e.g., output lead 104, FIG. 1), one or more transistor dies 440, 441 (e.g., transistor 140, FIG. 1 or amplifiers 340, 341, FIG. 3), an input impedance matching circuit 410, 411 (e.g., input impedance matching circuit 110, FIG. 1 or portions of input matching networks 310, 311, FIG. 3), an output impedance matching circuit 450, 451 (e.g., output impedance matching circuit 150, FIG. 1 or portions of output matching networks 350, 351, FIG. 3), an input-side video bandwidth circuit 460, 461 (e.g., video bandwidth circuits 160, 360, 361, FIGS. 1, 3), an output-side video bandwidth circuit 462, 463 (e.g., video bandwidth circuit 162, 362, 363, FIGS. 1, 3), and an output-side harmonic termination circuit 470, 471 (e.g., harmonic termination circuit 170, 370, 371, FIGS. 1, 3).

The input and output leads 402-405 are mounted on a top surface of the isolation structure 408 on opposite sides of the central opening, and thus the input and output leads 402-405 are elevated above the top surface of the flange 406, and are electrically isolated from the flange 406. Generally, the input and output leads 402-405 are oriented to allow for attachment of wirebonds between the input and output leads 402-405 and components and elements within the central opening of isolation structure 408.

Each transistor die 440, 441 includes an integrated power FET (e.g., FET 443, FIG. 4C), where each FET has a control terminal (e.g., a gate terminal 142, FIG. 1) and two current conducting terminals (e.g., a drain terminal 144 and a source terminal 145, FIG. 1). The control terminal of the FET within each transistor die 440, 441 is coupled through an input impedance matching circuit 410, 411 to an input lead 402, 403. In addition, one current conducting terminal (e.g., the drain terminal) of the FET within each transistor die 440, 441 is coupled through an output impedance matching circuit 450, 451 to an output lead 404, 405. The other current conducting terminal (e.g., the source terminal) of the FET within each transistor die 440, 441 is electrically coupled through the die 440, 441 to the flange 406 (e.g., to ground), in an embodiment.

On the input side of the amplification paths 420, 421, device 400 includes input impedance matching circuits 410, 411 (e.g., matching circuits 110, 310, 311, FIGS. 1, 3), video bandwidth circuits 460, 461 (e.g., VBW circuits 160, 360, 361, FIGS. 1, 3), and bias circuits 490 (e.g., bias circuit 190, FIG. 1) coupled between the input leads 402, 403 and the inputs (e.g., gate terminals) of power transistor dies 440, 441.

To best explain the input side of device 400, reference is now made to FIGS. 4A and 4B, which include enlarged top and side, cross-sectional views of a portion of device 400 that is enclosed within box 4B of FIG. 4A. More specifically, FIGS. 4A and 4B are top and side-cross-sectional views, respectively, of the input side of the peaking amplifier path 421, which includes embodiments of input impedance matching circuit 411 (e.g., input matching circuit 110, 311, FIGS. 1, 3) and video bandwidth circuit 461 (e.g., circuit 160, 361, FIGS. 1, 3). It should be briefly noted here that the input side of the carrier amplifier path 420 may be identical to the input side of the peaking amplifier path 421, and therefore the description, below, of the input side of the peaking amplifier path 421 applies equally to the input side of the carrier amplifier path 420. As discussed previously (and elaborated below), the input side of the carrier amplifier path 420 alternatively may be different from the input side of the peaking amplifier path 421.

The portion of device 400 illustrated in FIG. 4B includes the input (gate) side of power transistor die 441 (e.g., the peaking amplifier die), a portion of input lead 403, and input-side IPD assembly 481. For enhanced understanding, FIG. 4C includes a cross-sectional, side view of the portion of the RF power amplifier device of FIG. 4B along line 4C-4C, in accordance with an example embodiment. More specifically, FIG. 4C is a cross-sectional view through input lead 403, IPD assembly 481, a portion of flange 406, and transistor die 441. As indicated in FIG. 4C, the power transistor die 441 and the IPD assembly 481 are coupled to the conductive flange 406, and the input lead 403 is electrically isolated from the conductive flange 406 (e.g., using an isolation structure 408).

The power transistor die 441 includes a transistor input terminal 442 (e.g., a conductive bond pad), which is electrically connected within the power transistor die 441 to a control terminal (e.g., a gate terminal) of a single-stage or final-stage FET 443 integrated within the die 441. As discussed previously, each FET 443 may include a III-V field effect transistor (e.g., a HEMT), such as a GaN FET (or another type of III-V transistor, including a GaAs FET, a GaP FET, an InP FET, or an InSb FET). More specifically, each FET 443 may be integrally formed in and on a base semiconductor substrate 447 (e.g., a GaN substrate, a GaN-on-silicon substrate, a GaN-on-silicon carbide substrate, and so on). Conductive connections between the control terminal of the FET 443 (e.g., the gate terminal) and the input terminal 442 of the die 441 may be made through a build-up structure 448 of alternating dielectric and patterned conductive layers, where portions of the patterned conductive layers are electrically connected using conductive vias. A conductive layer 449 on a bottom surface of the die 441 may provide a ground node (e.g., for the source terminal, which may be connected to the conductive layer 449 (and thus to the conductive flange 406) using through substrate vias or doped sinker regions (not shown)).

The IPD assembly 481 also may include a base semiconductor substrate 485 (e.g., a silicon substrate, a silicon carbide substrate, a GaN substrate, or another type of semiconductor substrate, which may be referred to as an "IPD substrate" herein) and a build-up structure 486 of alternating dielectric and patterned conductive layers, where portions of the patterned conductive layers are electrically connected using conductive vias. As will be discussed in more detail below, various electrical components of the input impedance matching circuit 411 and the video bandwidth circuit 461 are integrally formed within and/or connected to the IPD assembly 481. These electrical components may be electrically connected to conductive bond pads (e.g., bond pads 413, 415) at the top surface of the IPD assembly 481, and also may be electrically connected to the conductive flange 406 (e.g., to ground) using through substrate vias to the conductive layer 487 on a bottom surface of the IPD assembly 481.

First, connections between the transistor die 441 and the input lead 403 through the input impedance matching circuit 411 will be described in more detail. More specifically, the input lead 403 is electrically coupled, through an instance of an input impedance matching circuit 411, to the input terminal 442 of the transistor die 441. The input terminal 442, in turn, is electrically coupled to the control terminal (e.g., the gate terminal) of the FET 443 within the transistor die 441.

For example, in an embodiment, the input impedance matching circuit 411 may include three inductive elements 412, 416, 420 (e.g., inductive elements 112, 116, 120, FIG. 1) and two shunt capacitors 414, 418 (e.g., shunt capacitances 114, 118, FIG. 1). The first inductive element 412 (e.g., inductive element 112, FIG. 1) may be implemented as a first set of wirebonds that are coupled between the input lead 403 and a conductive bond pad 413 (e.g., corresponding to connection node 113, FIG. 1) on a top surface of the IPD assembly 481. The second inductive element 416 (e.g., inductive element 116, FIG. 1) may be implemented as a second set of wirebonds that are coupled between bond pad 413 and bond pad 415 (corresponding to connection node 115, FIG. 1) of the IPD assembly 481. In alternate embodiments, the second inductive element (e.g., inductive element 116, FIG. 1) may be implemented as one or more transmission line segments (e.g., conductive coils) that are integrally formed as part of the IPD assembly 481 or as one or more discrete inductors ("chip inductors"), which are electrically coupled between bond pads 413 and 415. Finally, the third inductive element 420 (e.g., inductive element 120, FIG. 1) may be implemented as a third set of wirebonds that are coupled between bond pad 415 and the input terminal 442 of the transistor die 441.

According to an embodiment, a first electrode (or terminal) of the shunt capacitor 418 (e.g., shunt capacitor 118, FIG. 1) is electrically coupled to the conductive bond pad 413, and a second electrode (or terminal) of the shunt capacitor 418 is electrically coupled to the conductive flange (e.g., using conductive through substrate vias that extend through the semiconductor substrate 485). According to a further embodiment, a first electrode (or terminal) of the shunt capacitor 414 (e.g., shunt capacitor 114, FIG. 1) is electrically coupled to the conductive bond pad 415, and a second electrode (or terminal) of the shunt capacitor 414 is electrically coupled to the conductive flange. The shunt capacitors 414, 418 may be implemented as MIM capacitors (or a set of parallel-coupled MIM capacitors) that are integrally formed as parts of the IPD assembly 481. In alternate embodiments, wither or both of the shunt capacitors 414, 418 may be implemented using one or more discrete capacitors coupled to a top surface of the IPD assembly 481, or using another type of capacitor.

As mentioned above, and as illustrated in FIG. 4A, the carrier and peaking amplifier paths 420, 421 each may include an identical input matching network (e.g., a double T-match configuration of network 110, FIG. 1). In an alternate embodiment, and particularly in an embodiment in which the Doherty amplifier is an asymmetric Doherty amplifier, the carrier and peaking paths 420, 421 may have different circuit configurations. For example, in an asymmetric Doherty amplifier embodiment in which the peaking amplifier transistor periphery is significantly larger than the carrier amplifier transistor periphery (e.g., twice as large), the input impedance matching network 411 of the peaking amplifier path 421 may have the double T-match configuration of input matching network 110 (FIGS. 1, 3) to compensate for the larger $C_{ds}$ of the peaking amplifier transistor, while the input impedance matching network 410 of the carrier amplifier path 420 may have a different configuration. For example, the input impedance matching network 410 of the carrier amplifier path 420 may have a single T-match configuration (e.g., circuit 110', FIG. 3). Alternatively, the carrier input impedance matching network 410 may have some other configuration that differs from input matching network 110 or 110' (e.g., a PI network, a bandpass filter network, or some other configuration). Either way, FIG. 4A indicates that the carrier input-side IPD 480, which includes components for a double T-match network (e.g., circuit 110, FIGS. 1, 3), could be replaced with an alternate input-side IPD 480' (shown in the below left corner of FIG. 4A), which includes components for a single T-match network (e.g., circuit 110', FIG. 3).

As mentioned above, a video bandwidth circuit 461 is included in input-side IPD assembly 481, in an embodiment. Video bandwidth circuit 461 may have any one of a number of configurations, in various embodiments, such as but not limited to one of the configurations illustrated in FIGS. 2A-2F. In the embodiment illustrated in FIGS. 4B and 4C, which corresponds to the video bandwidth circuit 205 of FIG. 2F, the video bandwidth circuit 461 includes a series combination of an envelope resistor 464 (e.g., resistor 264, FIG. 2F), an envelope inductor 462 (e.g., inductor 262, FIG. 2F), and an envelope capacitor 466 (e.g., capacitor 266, FIG. 2F) electrically connected between node 415 (e.g., node 115, 215, FIGS. 1, 2F, which may correspond to or be coupled to an RF low-impedance point) and a ground reference (e.g., flange 406). In addition, the video bandwidth circuit 461 includes a bypass capacitor 478 (e.g., bypass capacitor 278, FIG. 2F) connected in parallel with envelope inductor 462. In the embodiment of FIG. 4B, two instances of the parallel combination of envelope inductor 462 and bypass capacitor 478 are implemented on opposite sides of the IPD assembly 481. More specifically, the parallel combinations of envelope inductor 462 and capacitor 478 are connected in parallel between envelope resistor 464 and envelope capacitor 466, in the illustrated embodiment. In an alternate embodiment, the video bandwidth circuit 461 may include only one instance of the combination of envelope inductor 462 and capacitor 478, or more than two instances of the combination of envelope inductor 462 and capacitor 478.

In the embodiment of FIGS. 4B, 4C, envelope resistor 464 is integrally formed as part of the IPD assembly 481. For example, each envelope resistor 464 may be a polysilicon resistor formed from a layer of polysilicon on or within build-up structure 486, and electrically coupled between bond pad 415 and the parallel combination of envelope inductor 462 and bypass capacitor 478. In other alternate embodiments, the envelope resistor 464 may be formed from tungsten silicide or another material, may be a thick or thin film resistor, or may be a discrete component coupled to a top surface of IPD assembly 481.

The envelope inductor 462 also may be integrally formed as part of the IPD assembly 481, as is illustrated in the embodiment of FIGS. 4B and 4C. For example, each envelope inductor 462 may be a patterned conductor formed from portion(s) of one or more conductive layers of the build-up structure 486, where a first end of the conductor is electrically coupled to envelope resistor 464, and a second end of the conductor is electrically coupled to a first terminal of envelope capacitor 466. In alternate embodiments, each envelope inductor 462 may be implemented as a plurality of wirebonds, or as a spiral inductor (e.g., on or proximate to the top surface of IPD assembly 481), or as a discrete inductor coupled to a top surface of IPD assembly 481.

A bypass capacitor 478 is coupled in parallel with each envelope inductor 462, in an embodiment. Each of the bypass capacitors 478 may be, for example, a discrete capacitor that is connected (e.g., using solder, a conductive epoxy, or other means) to a top surface of IPD assembly 481. More specifically, a first terminal of each bypass capacitor 478 may be electrically coupled to the envelope resistor 464 and to a first terminal of the envelope inductor 462, and a second terminal of each bypass capacitor 478 may be connected to a second terminal of the envelope inductor 462 and to a first terminal of envelope capacitor 466.

For example, each bypass capacitor 478 may be a multiple-layer capacitor (e.g., a multiple-layer ceramic capacitor) with parallel, interleaved electrodes and wrap-around end terminations. Alternatively, each bypass capacitor 478 may form a portion of a separate IPD (e.g., a MIM capacitor formed on a semiconductor substrate), or may be a capacitor (e.g., a MIM capacitor) that is integrally formed with the semiconductor substrate of the IPD assembly 481. Alternatively, each bypass capacitor 478 may be implemented as some other type of capacitor capable of providing the desired capacitance for the video bandwidth circuit 461.

The envelope capacitor 466 is electrically coupled between a ground reference node (e.g., conductive layer 487 at the bottom surface of the IPD assembly 481) and the parallel combination of envelope inductor 462 and bypass capacitor 478. Capacitor 466 may be a MIM capacitor that is integrally formed with the IPD substrate of IPD assembly 481, for example. In some embodiments, capacitor 466 may be formed in the build-up structure 486 entirely above the semiconductor substrate 485, or capacitor 466 may have portions that extend into the semiconductor substrate 485 or are otherwise coupled to, or in contact with, the semiconductor substrate 485. Alternatively, envelope capacitor 466 may be, for example, a discrete capacitor that is connected (e.g., using solder, a conductive epoxy, or other means) to a top surface of the IPD assembly 481. Although particular two-plate capacitor structures are shown in FIG. 4C for capacitors 414, 418, and 466, a variety of other capacitor structures alternatively may be utilized, as would be understood by one of skill in the art based on the description herein.

Referring again to FIG. 4A, and transitioning now to the output side of the amplification paths 420, 421, device 400 also includes output impedance matching circuits 450, 451 (e.g., matching circuits 150, 350, 351, FIGS. 1, 3), video bandwidth circuits 462, 463 (e.g., VBW circuits 162, 362, 363, FIGS. 1, 3), harmonic termination circuits 470, 471 (e.g., circuits 170, 370, 371, FIGS. 1, 3), and bias circuits 491 (e.g., bias circuit 191, FIG. 1) coupled between the outputs (e.g., drain terminals) of power transistor dies 440, 441 and output leads 404, 405.

As with the input side, some of the components of the output impedance matching circuits 450, 451, video bandwidth circuits 462, 463, and harmonic termination circuits 470, 471 may be implemented with wirebonds and components that are integrated within IPD assemblies 482, 483. Briefly, the inductive components (e.g., inductances 152, 154, 172, FIG. 1) of each output impedance matching circuit 450, 451 and harmonic termination circuit 470, 471 may be implemented with wirebonds, as shown in FIG. 4A. For example, a first set of wirebonds corresponding to inductance 152, FIG. 1 may be coupled between a conductive die bond pad connected to the current conducting terminal (e.g., the drain terminal 144, FIG. 1) of a FET within each transistor die 440, 441 and an output lead 404, 405 (e.g., output lead 104, FIG. 1). A second set of wirebonds corresponding to inductance 154, FIG. 1 may be coupled between the same die bond pad and a conductive bond pad of IPD assembly 482 or 483, which corresponds to node 158, FIG. 1. A third set of wirebonds corresponding to inductance 172, FIG. 1 may be coupled between the output lead 404, 405 and another conductive bond pad of IPD assembly 482 or 483, which corresponds to node 173 in FIG. 1. The capacitances 156 and 176 and the various components of video bandwidth circuit 162, FIG. 1, all may be integrally included within each IPD assembly 482, 483. Essentially, each video bandwidth circuit 462, 463 is coupled between an IPD node/bond pad (e.g., RF low-impedance node 158, FIG. 1) and a ground reference (e.g., flange 406). Further, each harmonic termination circuit 470, 471 is coupled between an output lead 404, 405 and the ground reference.

In addition to the above described elements, each amplification path 420, 421 of device 400 includes gate and drain bias circuitry 490, 491 (e.g., bias circuits 190, 191, FIG. 1). In the embodiment of FIG. 4A, each of the bias circuits includes an inductive element in the form of a wirebond 492, 494 (e.g., inductive element 192, 194, FIG. 1), which has a first end electrically coupled (through an IPD 480-483 and additional wirebonds) to the gate or drain bond pads of dies 440, 441, and a second end connected to the proximal (interior) end of a bias lead 493, 495 (e.g., bias leads 193, 195, FIG. 1). In addition, each of the bias circuits includes one of the bias lead 493, 495, and a capacitor 496, 498 (e.g., capacitor 196, 198, FIG. 1). For example, each capacitor 496, 497 may be a discrete capacitor with a first terminal coupled to the distal (exterior) end of a bias lead 493, 495, and a second terminal coupled to a ground reference node (e.g., a ground node on a PCB to which the device 400 is connected). As mentioned previously, in alternate embodiments, the gate and/or drain bias voltages alternatively may be provided through the input leads 402, 403 and/or the output leads 404, 405.

In the example of FIGS. 4A-C, device 400 includes two transistor dies 440, 441 that essentially function in parallel, although another semiconductor device may include a single transistor die or more than two transistor dies, as well. In addition, device 400 includes two input-side IPD assemblies 480, 481 and two output-side IPD assemblies 482, 483, which also essentially function in parallel. It is to be understood that more or fewer of IPD assemblies 480-483 may be implemented, as well.

According to an embodiment, device 400 is incorporated in an air cavity package, in which transistor dies 440, 441, the IPD assemblies 480-483, and various other components are located within an enclosed air cavity. Basically, the air cavity is bounded by flange 406, isolation structure 408, and a cap (not shown) overlying and in contact with the isolation structure 408 and leads 402-405, 492-495. In other embodiments, the components of device 400 may be incorporated into an overmolded package (i.e., a package in which the electrical components within the active device area are encapsulated with a non-conductive molding compound, and in which proximal (interior) portions of the leads 402-405, 492-495 also may be encompassed by the molding compound). In an overmolded package, isolation structure 408 may be excluded, and the leads 402-405, 492-495 may be electrically isolated from the flange 406 with the molding compound.

The embodiments of amplifier circuits and power transistor devices described illustrated and described in conjunction with FIGS. 1-3 and 4A-C may be considered to be "pseudo" class F amplifiers, as these embodiments do not specifically include third harmonic control circuitry. In other alternate embodiments, which will be described in conjunction with FIGS. 5 and 6, third harmonic control circuitry (e.g., circuit 570, 670, 671, FIGS. 5, 6) may be connected to the output (e.g., drain) of the power transistor die, resulting in a power amplifier circuit with "true" inverse class F operation.

Referring first to FIG. 5, a schematic diagram of an RF power amplifier circuit 500 is presented, which may be implemented within a packaged power transistor device, in accordance with an alternate embodiment. Power amplifier circuit 500 may be considered a "true" inverse class F amplifier. Circuit 500 is identical in many respects to circuit 100 (FIG. 1), in that circuit 500 also includes an input lead 102, an input impedance matching circuit 110, a transistor 140, an output impedance matching circuit 150, video bandwidth circuits 160, 162, harmonic termination circuit 170, bias circuits 190, 191, and an output lead 104, in an embodiment. Each of these components and circuits may be identical to those described in conjunction with FIG. 1. For the purpose of brevity, the description of those components and circuits is not repeated here, but is intended to be incorporated into this description of power amplifier circuit

500. The components of circuit 500 that are incorporated within a discrete packaged amplifier device (e.g., device 600, FIG. 6) are encompassed by box 501.

Circuit 500 differs from circuit 100 (FIG. 1) in that circuit 500 also includes an additional harmonic control circuit 570, which is configured to resonate at the third harmonic of the fundamental frequency of operation. With the inclusion of the third harmonic control circuit 570, circuit 500 is capable of operation in a "true" inverse class F mode.

According to an embodiment, the harmonic termination circuit 570 is configured to resonate at the third harmonic of the fundamental frequency of operation of amplifier 500. Circuit 570 is coupled between output terminal 144 (e.g., drain terminal) of transistor 140 and ground (or another voltage reference). Harmonic termination circuit 570 includes inductive element 572 (e.g., an additional set of wirebonds) and capacitance 576 coupled in series between the output terminal 144 and ground (or another voltage reference), and this series combination of elements functions as a low impedance path to ground for signal energy at a third harmonic of a fundamental frequency of operation of circuit 500. According to an embodiment, inductive element 572 may have an inductance value in a range between about 50 pH to about 500 pH, and capacitance 576 may have a capacitance value in a range between about 0.5 pF to about 3.0 pF, although these components may have values outside of these ranges, as well. For example, at an example fundamental frequency of operation of 2.0 GHz, which has a third harmonic frequency at 6.0 GHz, inductive element 572 may have an inductance value of about 120 pH, and capacitance 576 may have a capacitance value of about 6 pF to appropriately resonate at the third harmonic frequency.

Figure 6:
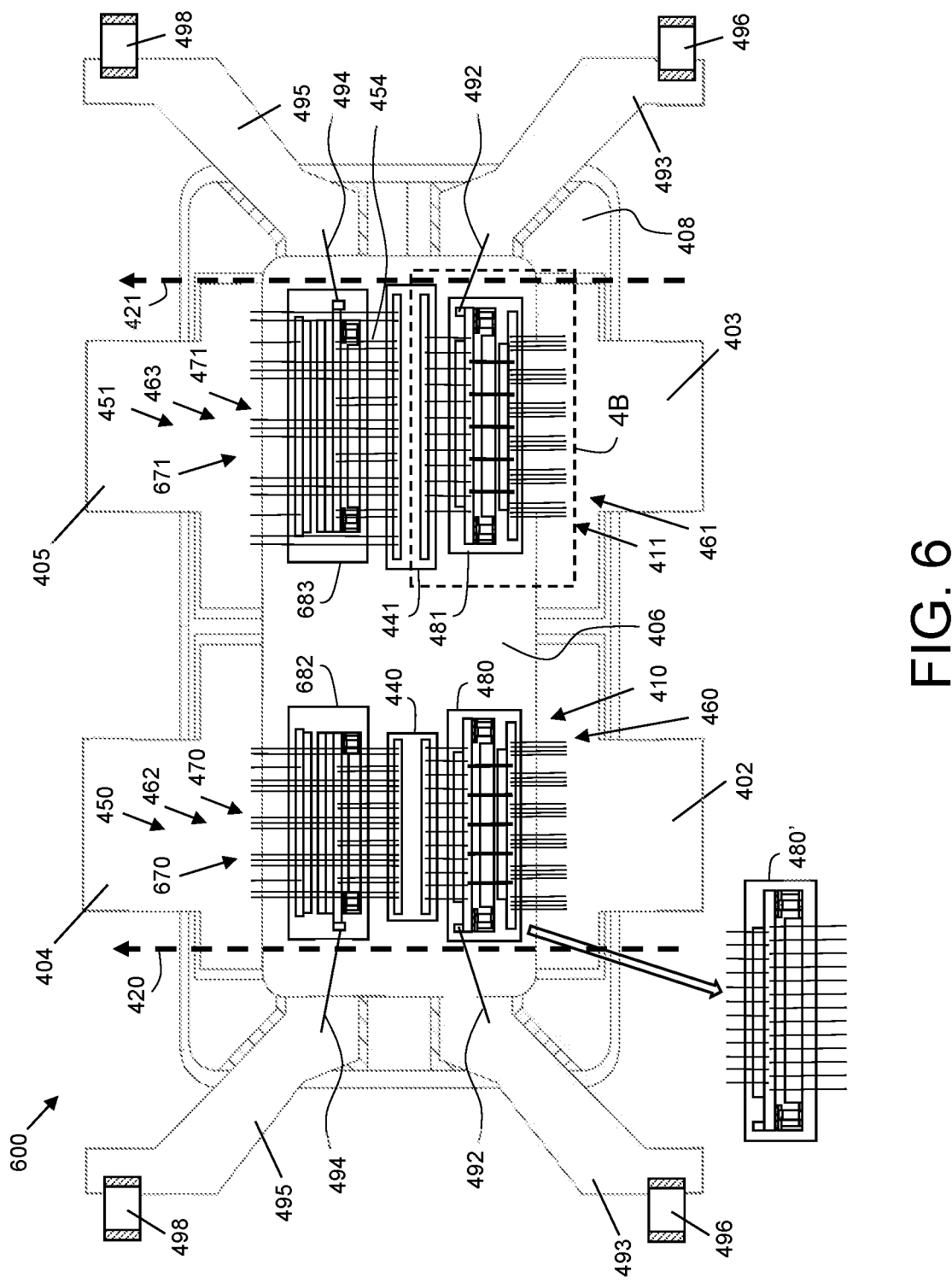
FIG. 6 is a top view of a packaged RF power amplifier device, in accordance with another example embodiment.

As with amplifier 100, the various components of amplifier 500 may be implemented in a discrete, packaged power amplifier device. For example, FIG. 6 is a top view of an embodiment of a packaged RF amplifier device 600 that embodies two parallel instances of the circuit 500 of FIG. 5, and which may be utilized to provide amplifiers (e.g., amplifiers 340, 341, FIG. 3), and portions of matching networks (e.g., portions of matching networks 310, 311, 350, 351, FIG. 3) in a Doherty amplifier (e.g., Doherty amplifier 300, FIG. 3).

Device 600 is identical in many respects to device 400 (FIG. 4A), in that device 600 also includes two input-side IPD assemblies 480, 481, each of which includes portions of an input impedance matching circuit 410, 411 (e.g., circuit 110, 310, 311 FIGS. 3, 5), and a video bandwidth circuit 460, 461 (e.g., circuit 160, 360, 361, FIGS. 3, 5). Further, device 600 includes two output-side IPD assemblies 682, 683, each of which includes portions of an output impedance matching circuit 450, 451 (e.g., circuit 150, 350, 351 FIGS. 3, 5), a video bandwidth circuit 462, 463 (e.g., circuit 162, 362, 363, FIGS. 3, 5) and a harmonic termination circuit 470, 471 (e.g., circuit 170, 370, 371, FIGS. 3, 5). Each of these components and circuits may be identical to those described in conjunction with FIG. 4. For the purpose of brevity, the description of those components and circuits is not repeated here, but is intended to be incorporated into this description of power amplifier device 600.

Device 600 differs from device 400 (FIG. 4A) in that device 600 also includes additional third harmonic control circuits 670, 671, which are configured to resonate at the third harmonic of the fundamental frequency of operation. With the inclusion of the third harmonic control circuits 670, 671, device 600 is capable of operation in a "true" inverse class F mode. According to an embodiment, the inductance 572 (FIG. 5) of each of the third harmonic control circuits

670, 671 is implemented with an additional set of wirebonds coupled between the output bond pad (drain bond pad) of each die 440, 441 and a bond pad of each IPD assembly 682, 683. The capacitance 576 (FIG. 5) of each of the third harmonic control circuits 670, 671 is implemented with an additional capacitor that is integrally formed within or coupled to each IPD assembly 682, 683. Accordingly, IPD assemblies 682, 683 may be very similar to IPD assemblies 482, 483 (FIG. 4A), except that IPD assemblies 682, 683 each include an additional shunt capacitor corresponding to capacitance 576 (FIG. 5).

FIGS. 4A-C and 6 illustrate embodiments of RF amplifier devices that include input and output leads coupled to a substrate (e.g., with intervening electrical isolation), along with IPDs and transistor dies that are also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which carrier and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

To better convey the potential advantages of the proposed circuits, FIGS. 7A and 7B are Smith charts 700, 750 depicting impedance trajectories at the fundamental frequency for amplifiers with and without the input impedance matching topology of the example amplifier embodiments of FIGS. 1 and 5. More particularly, Smith chart 700 depicts the fundamental frequency impedance trajectory of an embodiment of an input impedance matching circuit (e.g., circuit 110, FIGS. 1, 5) with a double T-match topology between the intrinsic input impedance, Zin, of the power transistor (e.g., power transistor 443, FIG. 4C) to the lead plane of the package (e.g., to input lead 403, FIGS. 4A, 6). Conversely, Smith chart 750 depicts the fundamental frequency impedance trajectory of a conventional input impedance matching circuit (e.g., circuit 110', FIG. 3) with a single input T-match topology between the intrinsic input impedance, Zin, of the power transistor to the lead plane of the package.

In both Smith charts 700, 750, circle 710 is defined by the intrinsic Q factor of a GaN die (e.g., a power transistor die 441, FIGS. 4A-C, 6, that includes a GaN power transistor). In order to avoid impedance dispersion over the bandwidth of operation, which may bring undesirable losses, the double T-match topology of the various embodiments is designed so that all impedance movements stay within the intrinsic Q circle 710. In contrast, the single input T-match topology of a conventional impedance matching circuit extends outside the intrinsic Q circle, as will be described below.

Referring first to Smith chart 700, which corresponds to a double T-match topology of an example embodiment, impedance movements will be described starting at the intrinsic Zin of the power transistor (e.g., transistor 140, FIGS. 1, 4B-C, 5) to the lead plane of the package, noting that, for a simpler depiction, movements associated with the connection wirebonds (e.g., corresponding to inductive component 112, FIGS. 1, 5) are not shown in the Smith charts 700, 750.

Point 720 corresponds to the intrinsic Zin of the GaN transistor (e.g., transistor 140, FIGS. 1, 4B-C, 5). The first movement from point 720 to point 722 is provided by a first series inductance (e.g., inductance/wirebonds 120, 420, FIGS. 1, 4B-C, 5), the second movement from point 722 to point 724 is provided by a first shunt capacitance (e.g., capacitor/capacitance 114, 414, FIGS. 1, 4B-C, 5), the third movement from point 724 to point 726 is provided by a second series inductance (e.g., inductance/wirebonds 116, 416, FIGS. 1, 4B-C, 5), and a final movement from point 726 to 728 is provided by a second shunt capacitance (e.g., capacitance/capacitor 118, 418, FIGS. 1, 4B-C, 5). It is apparent from Smith chart 700 that the double T-match topology can avoid transgressions outside of circle 710, which avoids undesirable dispersion and associated losses over the bandwidth of operation.

Referring now to Smith chart 750, which corresponds to a single T-match topology of a conventional input impedance matching circuit (e.g., circuit 110', FIG. 3), point 760 corresponds to the intrinsic Zin of a GaN transistor. The first movement from point 760 to point 762 is provided by the only series inductance, and the second and final movement from point 762 to point 764 is provided by the only shunt capacitance. In contrast with Smith chart 700, it is apparent from Smith chart 750 that the single T-match topology transgresses outside of circle 710 through the second movement, which may result in undesirable dispersion and associated losses over the bandwidth of operation.

Comparison of the results shown in Smith charts 700 and 750 indicate that it is easier to reach higher real part impedance values using the double T-match topology, while keeping the Q factor transformation in line with the intrinsic Zin Q factor of the power transistor. This improved Q factor quality of the double T-match topology may result in less dispersive impedances at the lead plane with less associated losses. In addition, the double T-match topology makes the design less sensitive to wirebond loop height variation, because the topology is less frequency dispersive than a single T-match topology.

FIG. 7C is a Smith chart 780 depicting the impedance trajectory at the second harmonic frequency of an embodiment of an amplifier with the input impedance matching topology of the example amplifier embodiments of FIGS. 1 and 5. More particularly, Smith chart 780 depicts the second harmonic frequency impedance trajectory of an embodiment of an input impedance matching circuit (e.g., circuit 110, FIGS. 1, 5) with a double T-match topology between the intrinsic input impedance, Zin, of the power transistor (e.g., power transistor 443, FIG. 4C) to the lead plane of the package (e.g., to input lead 403, FIGS. 4A, 6). Also, in Smith chart 780, circle 710 is defined by the intrinsic Q factor of a GaN die (e.g., a power transistor die 441, FIGS. 4A-C, 6, that includes a GaN power transistor).

In Smith chart 780, point 782 corresponds to the intrinsic Zin of the GaN transistor (e.g., transistor 140, FIGS. 1, 4B-C, 5). The first movement from point 782 to point 784 is provided by a first series inductance (e.g., inductance/wirebonds 120, 420, FIGS. 1, 4B-C, 5), the second movement from point 784 to point 786 is provided by a first shunt capacitance (e.g., capacitor/capacitance 114, 414, FIGS. 1,

4B-C, 5), the third movement from point 786 to point 788 is provided by a second series inductance (e.g., inductance/ wirebonds 116, 416, FIGS. 1, 4B-C, 5), the fourth movement from point 788 to point 790 is provided by a second shunt capacitance (e.g., capacitance/capacitor 118, 418, FIGS. 1, 4B-C, 5), and a final movement from point 790 to 792 is provided by a third series inductance (e.g., inductance/ wirebonds 112, 412, FIGS. 1, 4B-C, 5). It is apparent from Smith chart 780 that the double T-match topology (e.g., input impedance matching circuit 110, FIGS. 1, 5) is configured to produce or target a Zs_2f$_0$_extrinsic of around j*X, where 1.5<X<3.0.

An embodiment of a power amplifier device includes an amplification path implemented within a power amplifier package. The amplification path includes input and output package leads, a transistor die with transistor input and output terminals and a power transistor, and a two-stage input impedance matching circuit electrically coupled between the input package lead and the transistor input terminal. The two-stage input impedance matching circuit has a double T-match topology that includes a first resonator coupled to the first input package lead, and a second resonator coupled between the first resonator and the transistor input terminal. The amplification path also includes an output impedance matching circuit coupled between the transistor output terminal and the first output package lead, and a second output harmonic termination circuit coupled to the first output package lead.

Another embodiment of a power amplifier device forms a portion of a Doherty amplifier. The power amplifier device includes a power amplifier package, a peaking amplification path implemented within the power amplifier package, and a carrier amplification path implemented within the package. The peaking amplification path includes first input and output package leads coupled to the power amplifier package and extending between an interior of the power amplifier package and an exterior of the power amplifier package, a first transistor die encased within the power amplifier package and including a transistor input terminal, a transistor output terminal, and a first power transistor with an input terminal coupled to the transistor input terminal, and an output terminal coupled to the transistor output terminal, a two-stage input impedance matching circuit encased within the power amplifier package and electrically coupled between the first input package lead and the transistor input terminal. The two-stage input impedance matching circuit has a double T-match topology that includes a first resonator coupled to the first input package lead, and a second resonator coupled between the first resonator and the transistor input terminal. The peaking amplification path also includes an output impedance matching circuit encased within the power amplifier package and coupled between the transistor output terminal and the first output package lead, and a second output harmonic termination circuit encased within the power amplifier package and coupled to the first output package lead. The carrier amplification path includes second input and output package leads coupled to the power amplifier package and extending between an interior of the power amplifier package and an exterior of the power amplifier package, a second transistor die encased within the power amplifier package and including a second power transistor, an additional input impedance matching circuit encased within the power amplifier package and electrically coupled between the second input package lead and an input terminal of the second power transistor, an additional output impedance matching circuit encased within the power amplifier package and coupled between an output terminal of the second power transistor and the second output package lead, and an additional second output harmonic termination circuit encased within the power amplifier package and coupled to the second output package lead.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier device comprising:
a power amplifier package;
a first amplification path implemented within the power amplifier package, wherein the first amplification path includes a first input package lead coupled to the power amplifier package and extending between an interior of the power amplifier package and an exterior of the power amplifier package, a first output package lead coupled to the power amplifier package and extending between the interior of the power amplifier package and the exterior of the power amplifier package, a first transistor die encased within the power amplifier package and including a transistor input terminal, a transistor output terminal, and a first power transistor with an input terminal coupled to the transistor input terminal, and an output terminal coupled to the transistor output terminal, wherein the first power transistor is a gallium nitride transistor with a periphery in a range of 26-80 millimeters and an output capacitance in a range of 0.1-0.4 picofarads per millimeter (pF/mm), a two-stage input impedance matching circuit encased within the power amplifier package and electrically coupled between the first input package lead and the transistor input terminal, wherein the two-stage input impedance matching circuit has a double T-match topology that includes a first resonator coupled to the first input package lead, and a second resonator coupled between the first resonator and the transistor input terminal, an output impedance matching circuit encased within the power amplifier package and coupled between the transistor output terminal and the first output package lead, and a second output harmonic termination circuit encased within the power amplifier package and coupled to the first output package lead.

2. The amplifier device of claim 1, wherein the two-stage input impedance matching circuit comprises:
a first node coupled to the first input package lead;
the first resonator, which includes
a first capacitor coupled between the first node and a ground reference node, and
a first inductive element coupled between the first node and a second node; and
the second resonator, which includes
a second capacitor coupled between the second node and the ground reference node, and
a second inductive element coupled between the second node and the transistor input terminal.

3. A power amplifier device comprising:
a power amplifier package;
a first amplification path implemented within the power amplifier package, wherein the first amplification path includes
a first input package lead coupled to the power amplifier package and extending between an interior of the power amplifier package and an exterior of the power amplifier package,
a first output package lead coupled to the power amplifier package and extending between the interior of the power amplifier package and the exterior of the power amplifier package,
a first transistor die encased within the power amplifier package and including a transistor input terminal, a transistor output terminal, and a first power transistor with an input terminal coupled to the transistor input terminal, and an output terminal coupled to the transistor output terminal, a two-stage input impedance matching circuit encased within the power amplifier package and electrically coupled between the first input package lead and the transistor input terminal, wherein the two-stage input impedance matching circuit has a double T-match topology that includes a first resonator coupled to the first input package lead, and a second resonator coupled between the first resonator and the transistor input terminal, wherein the two-stage input impedance matching circuit includes a first node coupled to the first input package lead, the first resonator, which includes a first capacitor coupled between the first node and a ground reference node, and a first inductive element coupled between the first node and a second node; and the second resonator, which includes a second capacitor coupled between the second node and the ground reference node, and a second inductive element coupled between the second node and the transistor input terminal, an output impedance matching circuit encased within the power amplifier package and coupled between the transistor output terminal and the first output package lead, and a second output harmonic termination circuit encased within the power amplifier package and coupled to the first output package lead; and a video bandwidth circuit coupled between the second node and the ground reference node, wherein the video bandwidth circuit includes a plurality of components, and wherein the plurality of components includes an envelope resistor, an envelope inductor, and an envelope capacitor coupled in series between the second node and the ground reference node.

4. The amplifier device of claim 2, further comprising:

a gate bias circuit coupled between the second node and the ground reference node.

5. The amplifier device of claim 2, wherein:

the first and second capacitors are integrally formed in an integrated passive device positioned between the first input package lead and the first transistor die; and the first and second inductive elements comprise first and second sets of wirebonds.

6. The amplifier device of claim 2, further comprising:

a third inductive element coupled between the first input package lead and the first node.

7. The amplifier device of claim 1, wherein the input impedance matching circuit is configured to produce a $Zs\_2f_0\_$extrinsic of $j*X$, where $1.3<X<3.0$.

8. The amplifier device of claim 1, wherein the output impedance matching circuit comprises:

a first inductive element coupled between the transistor output terminal and the first output package lead;

a second inductive element coupled between the transistor output terminal and a node; and a DC blocking capacitor coupled between the node and a ground reference node.

9. The amplifier device of claim 8, wherein the node is an RF cold point node, and the amplifier further comprises:

a video bandwidth circuit coupled between the node and the ground reference node, wherein the video bandwidth circuit includes a plurality of components, and wherein the plurality of components includes an envelope resistor, an envelope inductor, and an envelope capacitor coupled in series between the node and the ground reference node.

10. The amplifier device of claim 8, further comprising:

a drain bias circuit coupled between the node and the ground reference node.

11. The amplifier device of claim 8, wherein the second harmonic termination circuit is formed from a third inductive element and a second capacitor coupled in series between the first output package lead and a ground reference node, wherein the second harmonic termination circuit resonates at a second harmonic frequency of a fundamental frequency of operation of the amplifier.

12. A power amplifier device comprising:

a power amplifier package;

a first amplification path implemented within the power amplifier package, wherein the first amplification path includes a first input package lead coupled to the power amplifier package and extending between an interior of the power amplifier package and an exterior of the power amplifier package, a first output package lead coupled to the power amplifier package and extending between the interior of the power amplifier package and the exterior of the power amplifier package, a first transistor die encased within the power amplifier package and including a transistor input terminal, a transistor output terminal, and a first power transistor with an input terminal coupled to the transistor input terminal, and an output terminal coupled to the transistor output terminal, a two-stage input impedance matching circuit encased within the power amplifier package and electrically coupled between the first input package lead and the transistor input terminal, wherein the two-stage input impedance matching circuit has a double T-match topology that includes a first resonator coupled to the first input package lead, and a second resonator coupled between the first resonator and the transistor input terminal, an output impedance matching circuit encased within the power amplifier package and coupled between the transistor output terminal and the first output package lead, wherein the output impedance matching circuit comprises:

a first inductive element coupled between the transistor output terminal and the first output package lead, a second inductive element coupled between the transistor output terminal and a node, and a DC blocking capacitor coupled between the node and a ground reference node, and a second output harmonic termination circuit encased within the power amplifier package and coupled to the first output package lead, wherein the second harmonic termination circuit is formed from a third inductive element and a second capacitor coupled in series between the first output package lead and a ground reference node, wherein the second harmonic termination circuit resonates at a second harmonic frequency of a fundamental frequency of operation of the amplifier, and wherein the second harmonic termination circuit is directly connected to the first output package lead.

13. The amplifier device of claim 11, wherein:

the DC blocking capacitor and the second capacitor are integrally formed in an integrated passive device positioned between the first transistor die and the first output package lead; and the first, second, and third inductive elements comprise first, second, and third sets of wirebonds.

14. The amplifier device of claim 13, further comprising:

a third harmonic termination circuit formed from a second inductive element and a second capacitor connected in series between the transistor output terminal and the ground reference node, wherein the third harmonic termination circuit resonates at a third harmonic frequency of the fundamental frequency of operation of the amplifier.

15. The amplifier device of claim 1, wherein:

the power amplifier package includes a conductive flange that functions as a ground reference node for the amplifier, and the first power transistor die is connected to the conductive flange.

16. A power amplifier device forming a portion of a Doherty amplifier, the power amplifier device comprising:

a power amplifier package;

a peaking amplification path implemented within the power amplifier package, wherein the peaking amplification path includes a first input package lead coupled to the power amplifier package and extending between an interior of the power amplifier package and an exterior of the power amplifier package, a first output package lead coupled to the power amplifier package and extending between the interior of the power amplifier package and the exterior of the power amplifier package, a first transistor die encased within the power amplifier package and including a transistor input terminal, a transistor output terminal, and a first power transistor with an input terminal coupled to the transistor input terminal, and an output terminal coupled to the transistor output terminal, wherein the first power transistor is a gallium nitride transistor with a periphery in a range of 26-80 millimeters and an output capacitance in a range of 0.1-0.4 picofarads per millimeter (pF/mm), a two-stage input impedance matching circuit encased within the power amplifier package and electrically coupled between the first input package lead and the transistor input terminal, wherein the two-stage input impedance matching circuit has a double T-match topology that includes a first resonator coupled to the first input package lead, and a second resonator coupled between the first resonator and the transistor input terminal, an output impedance matching circuit encased within the power amplifier package and coupled between the transistor output terminal and the first output package lead, and a second output harmonic termination circuit encased within the power amplifier package and coupled to the first output package lead; and a carrier amplification path implemented within the power amplifier package, wherein the carrier amplification path includes a second input package lead coupled to the power amplifier package and extending between an interior of the power amplifier package and an exterior of the power amplifier package, a second output package lead coupled to the power amplifier package and extending between the interior of the power amplifier package and the exterior of the power amplifier package, a second transistor die encased within the power amplifier package and including a second power transistor, an additional input impedance matching circuit encased within the power amplifier package and electrically coupled between the second input package lead and an input terminal of the second power transistor, an additional output impedance matching circuit encased within the power amplifier package and coupled between an output terminal of the second power transistor and the second output package lead, and an additional second output harmonic termination circuit encased within the power amplifier package and coupled to the second output package lead.

17. The amplifier device of claim 16, wherein the additional input impedance matching circuit includes an additional two-stage input impedance matching circuit.

18. The amplifier device of claim 16, wherein the additional input impedance matching circuit comprises a single-stage input impedance matching circuit.

19. The amplifier device of claim 16, wherein the two-stage input impedance matching circuit comprises:

a first node coupled to the first input package lead;

the first resonator, which includes a first capacitor coupled between the first node and a ground reference node, and a first inductive element coupled between the first node and a second node; and the second resonator, which includes a second capacitor coupled between the second node and the ground reference node, and a second inductive element coupled between the second node and the transistor input terminal.

* * * * *